(12) United States Patent
Hattori et al.

(10) Patent No.: US 12,231,795 B2
(45) Date of Patent: Feb. 18, 2025

(54) IMAGING ELEMENT AND IMAGING DEVICE

(71) Applicant: Sony Semiconductor Solutions Corporation, Kanagawa (JP)

(72) Inventors: Yuki Hattori, Kanagawa (JP); Satoko Iida, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 33 days.

(21) Appl. No.: 18/035,032

(22) PCT Filed: Dec. 17, 2021

(86) PCT No.: PCT/JP2021/046700
§ 371 (c)(1),
(2) Date: May 2, 2023

(87) PCT Pub. No.: WO2022/145254
PCT Pub. Date: Jul. 7, 2022

(65) Prior Publication Data
US 2023/0403483 A1 Dec. 14, 2023

(30) Foreign Application Priority Data
Dec. 28, 2020 (JP) .................................. 2020-219267

(51) Int. Cl.
*H04N 25/77* (2023.01)
*H01L 27/146* (2006.01)
(52) U.S. Cl.
CPC ....... *H04N 25/77* (2023.01); *H01L 27/14636* (2013.01)
(58) Field of Classification Search
CPC ...... H04N 25/77; H04N 25/59; H04N 25/771; H01L 27/14636; H01L 27/14612
See application file for complete search history.

(56) References Cited

U.S. PATENT DOCUMENTS 8,884,206 B2 11/2014 Oike
2012/0153126 A1* 6/2012 Oike ................. H01L 27/14625
250/208.1
(Continued)

FOREIGN PATENT DOCUMENTS

JP 2007124344 A 5/2007
JP 2012129798 A 7/2012
(Continued)

OTHER PUBLICATIONS

International Search Report (PCT/ISA/210), International Application No. PCT/JP2021/046700, dated Feb. 8, 2022.

*Primary Examiner* — Twyler L Haskins
*Assistant Examiner* — Angel L Garces-Rivera
(74) *Attorney, Agent, or Firm* — Michael Best & Friedrich LLP

(57) ABSTRACT

Imaging elements and imaging devices are disclosed. In one example, a potential of a charge retaining unit that retains a charge generated by photoelectric conversion is adjusted. An imaging element includes a photoelectric conversion unit, a charge retaining unit, a charge transfer unit, a reset unit, an image signal generating unit that generates an image signal, capacitive coupling wiring, and a potential adjustment unit. The capacitive coupling wiring is different from wiring that transmits control signals of the charge transfer unit, the reset unit, and the image signal generating unit and wiring that transmits a generated image signal and is capacitively coupled to the charge retaining unit. The potential adjustment unit applies an adjustment signal for adjusting the potential of the charge retaining unit via the capacitive coupling wiring.

19 Claims, 23 Drawing Sheets

(56) References Cited

U.S. PATENT DOCUMENTS

2013/0001403 A1    1/2013   Yamakawa
2020/0186732 A1    6/2020   Takizawa

FOREIGN PATENT DOCUMENTS

| WO | 2018110303 A1 | 6/2018 |
| WO | WO-2020059510 A1 | 3/2020 |
| WO | WO-2020121724 A1 | 6/2020 |

* cited by examiner

IMAGING ELEMENT AND IMAGING DEVICE

FIELD

The present disclosure relates to an imaging element and an imaging device.

BACKGROUND

Imaging devices that include a plurality of pixels that generates an image signal based on incident light and captures an image of a subject are used (see, for example, Patent Literature 1). In this imaging device, a charge generated by performing photoelectric conversion of incident light in the pixels is retained, and an image signal corresponding to the retained charge is generated and output.

CITATION LIST

Patent Literature

Patent Literature 1: JP 2007-124344 A

SUMMARY

Technical Problem

The above-described conventional technology has a disadvantage that the amount of electric charge that can be retained is insufficient in a case where the pixel size is reduced as the number of pixels increases.

Therefore, in the present disclosure, an imaging element and an imaging device that increase a charge retention capacity of a charge retaining unit that retains a charge generated by photoelectric conversion are provided.

Solution to Problem

An imaging element according to the present disclosure includes: a photoelectric conversion unit that performs photoelectric conversion of incident light, the photoelectric conversion unit formed on a semiconductor substrate; a charge retaining unit that retains a charge generated by the photoelectric conversion; a charge transfer unit that transfers the charge generated by the photoelectric conversion to the charge retaining unit; a reset unit that discharges the charge retained in the charge retaining unit; an image signal generating unit that generates an image signal on a basis of the charge retained in the charge retaining unit; capacitive coupling wiring that is different from wiring that transmits control signals of the charge transfer unit, the reset unit, and the image signal generating unit and wiring that transmits the generated image signal, the capacitive coupling wiring capacitively coupled with the charge retaining unit; and a potential adjustment unit that applies an adjustment signal for adjusting a potential of the charge retaining unit via the capacitive coupling wiring.

DESCRIPTION OF EMBODIMENTS

Imaging devices that include a plurality of pixels that generates an image signal based on incident light and captures an image of a subject are used. In this pixel, a photodiode, an amplification transistor, and a reset transistor are arranged. Incidentally, the photodiode photoelectrically converts the incident light, the amplification transistor amplifies a signal from the photodiode and outputs the amplified signal to a vertical signal line, and the reset transistor resets the potential of a control electrode of the amplification transistor. In such a pixel, an exposure period is started after the reset by the reset transistor. Charges generated by the photodiode during this exposure period are read out after the exposure period elapses and are retained in a ground capacitance of the control electrode of the amplification transistor. A signal corresponding to the retained charge is amplified by the amplification transistor and output.

In recent years, imaging devices, in which pixels are miniaturized with an increase in the number of pixels, are used. In such an imaging device, due to miniaturization of the pixels, the ground capacitance of the control electrode of the amplification transistor decreases, and the amount of electric charge that can be accumulated decreases. Therefore, in the above-described conventional technology, a voltage is applied to a vertical signal line to increase the voltage of the ground capacitance of the control electrode of the amplification transistor capacitively coupled to the vertical signal line, thereby increasing the amount of electric charge that can be retained.

However, in the above-described conventional technology, since the vertical signal line from which an image signal is output is used, there is a disadvantage that the period during which the voltage, for increasing the voltage of the ground capacitance of the control electrode of the amplification transistor can be applied, is limited, and thus it becomes difficult to adjust the potential of a region retaining the charge.

Therefore, it is expected to overcome the above-described disadvantage and to implement technology for easily adjusting the potential of a charge retaining unit that retains the charge generated by photoelectric conversion.

Hereinafter, embodiments of the present disclosure will be described in detail on the basis of the drawings. Description will be given in the following order. Note that in each of the following embodiments, the same parts are denoted by the same symbols, and redundant description will be omitted.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Configuration of Imaging Device 1. First Embodiment

[Configuration of Imaging Element]

Figure 1:
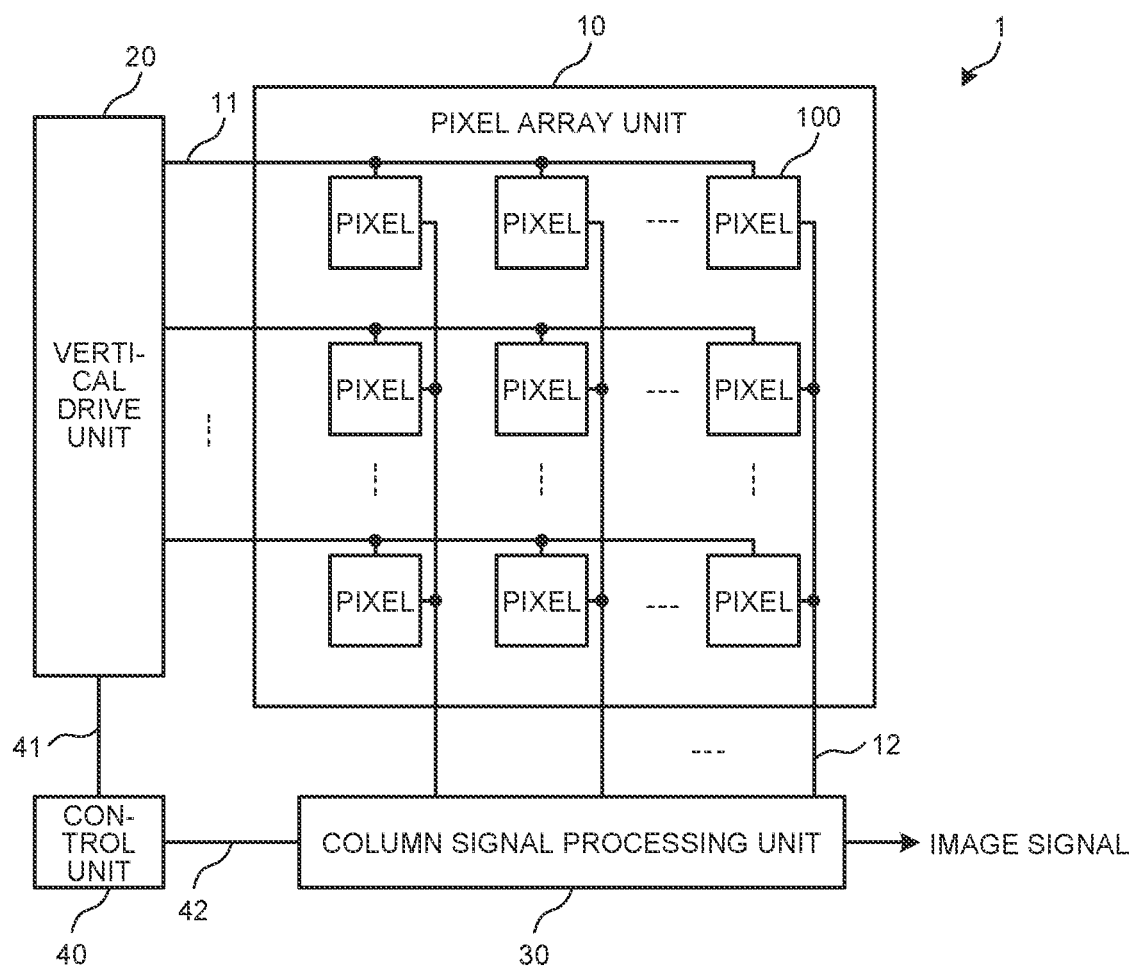
FIG. 1 is a diagram illustrating a configuration example of an imaging element according to an embodiment of the present disclosure.

FIG. 1 is a diagram illustrating a configuration example of an imaging element according to an embodiment of the present disclosure. FIG. 1 is a block diagram illustrating a configuration example of an imaging element 1. A semiconductor element according to an embodiment of the present disclosure will be described by taking the imaging element 1 as an example. The imaging element 1 is a semiconductor element that generates image data of a subject. The imaging element 1 includes a pixel array unit 10, a vertical drive unit 20, a column signal processing unit 30, and a control unit 40.

The pixel array unit 10 includes a plurality of pixels 100 arranged therein. The pixel array unit 10 in the drawing is an example in which the plurality of pixels 100 is arrayed in a shape of a two-dimensional matrix. Incidentally, a pixel 100 includes a photoelectric conversion unit that performs photoelectric conversion of incident light and generates an image signal of a subject on the basis of emitted incident light. For example, a photodiode can be used as the photoelectric conversion unit. Signal lines 11 and 12 are wired to each of the pixels 100. A pixel 100 is controlled by a control signal transmitted by a signal line 11 to generate an image signal and outputs the generated image signal via the signal line 12. Note that a signal line 11 is disposed for each of the rows shaping the two-dimensional matrix and is wired in a shared manner to a plurality of pixels 100 arranged in one row. A signal line 12 is disposed for each of the columns shaping the two-dimensional matrix and is wired in a shared manner to a plurality of pixels 100 arranged in one column.

The vertical drive unit 20 generates control signals for the pixels 100 described above. The vertical drive unit 20 in the drawing generates a control signal for each of the rows of the two-dimensional matrix of the pixel array unit 10 and sequentially outputs the control signals via a signal line 11.

The column signal processing unit 30 processes an image signal generated by a pixel 100. The column signal processing unit 30 in the drawing simultaneously processes image signals from a plurality of pixels 100 arranged in one row of the pixel array unit 10 transmitted via a signal line 12. As this processing, for example, analog-digital conversion for converting an analog image signal generated by a pixel 100 into a digital image signal or correlated double sampling (CDS) for removing an offset error of the image signal can be performed. The processed image signal is output to a circuit or the like outside the imaging element 1.

The control unit 40 controls the vertical drive unit 20 and the column signal processing unit 30. The control unit 40 in the drawing outputs control signals via each of a signal lines 41 and 42 to control the vertical drive unit 20 and the column signal processing unit 30. Note that the imaging element 1 in the drawing is an example of a semiconductor element described in the claims. The column signal processing unit 30 is an example of a processing circuit described in the claims.

[Configuration of Pixel]

Figure 2:
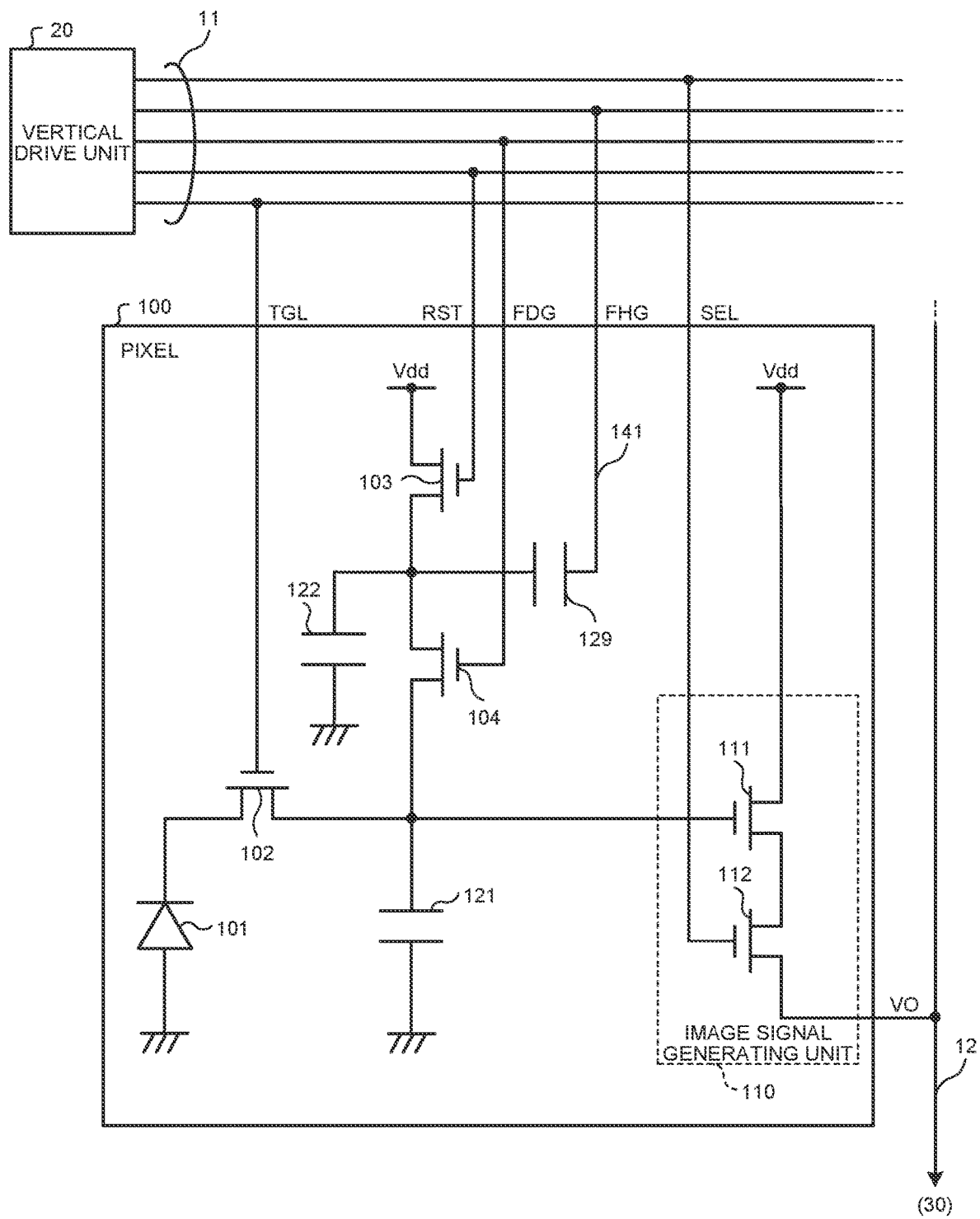
FIG. 2 is a diagram illustrating a configuration example of a pixel according to a first embodiment of the disclosure.

FIG. 2 is a diagram illustrating a configuration example of a pixel according to the first embodiment of the disclosure. The drawing is a circuit diagram illustrating a configuration example of a pixel 100. The pixel 100 in the drawing includes a photoelectric conversion unit 101, a charge transfer unit 102, a reset unit 103, an image signal generating unit 110, a first charge retaining unit 121, a second charge retaining unit 122, a coupling unit 104, a capacitor 129, and capacitive coupling wiring 141.

The image signal generating unit 110 includes MOS transistors 111 and 112. The MOS transistors 111 and 112, the charge transfer unit 102, the reset unit 103, and the coupling unit 104 can include an n-channel MOS transistor. In addition, the first charge retaining unit 121, the coupling unit 104, and the second charge retaining unit 122 are included in a charge retaining unit.

As described above, the signal lines 11 and 12 are wired to the pixels 100. The signal lines 11 in the drawing include a signal line TGL, a signal line RST, a signal line FDG, and a signal line SEL. The signal lines 11 further include capacitive coupling wiring 141. A signal line FHG in the drawing represents the capacitive coupling wiring 141. A signal line 12 includes a signal line VO. In addition, a power supply line Vdd is wired to the pixel 100. The power supply line Vdd is wiring that supplies power to the pixel 100. Note that the vertical drive unit 20 is further illustrated in the drawing.

An anode of the photoelectric conversion unit 101 is grounded, and a cathode is connected to a source of the charge transfer unit 102. A drain of the charge transfer unit 102 is connected to a source of the coupling unit 104, a gate of the MOS transistor 111, and a first end of the first charge retaining unit 121. A second end of the first charge retaining unit 121 is grounded. A drain of the coupling unit 104 is connected to a source of the reset unit 103, a first end of the second charge retaining unit 122, and a first end of the capacitor 129. A second end of the second charge retaining unit 122 is grounded, and a second end of the capacitor 129 is connected to the capacitive coupling wiring 141. The drain of the reset unit 103 is connected to the power supply line Vdd. A drain of the MOS transistor 111 is connected to the power supply line Vdd, and a source of the MOS transistor 111 is connected to a drain of the MOS transistor 112. A source of the MOS transistor 112 is connected to the signal line VO.

The signal line TGL, the signal line FDG, the signal line RST, and the signal line SEL are connected to the gate of the charge transfer unit 102, the gate of the coupling unit 104, the gate of the reset unit 103, and the gate of the MOS transistor 112, respectively.

The photoelectric conversion unit 101 performs photoelectric conversion of incident light. The photoelectric conversion unit 101 can include a photodiode formed on a semiconductor substrate 130 described later.

The first charge retaining unit 121 and the second charge retaining unit 122 retain charges. The first charge retaining unit 121 and the second charge retaining unit 122 retain charges generated by photoelectric conversion by the photoelectric conversion unit 101. The first charge retaining unit 121 and the second charge retaining unit 122 can include a floating diffusion (FD) region which is a semiconductor region formed in the semiconductor substrate 130.

The coupling unit 104 couples the first charge retaining unit 121 and the second charge retaining unit 122. The coupling unit 104 couples the first charge retaining unit 121 and the second charge retaining unit 122 by electrically connecting the first charge retaining unit 121 and the second charge retaining unit 122. When the first charge retaining unit 121 and the second charge retaining unit 122 are coupled, the first charge retaining unit 121 and the second charge retaining unit 122 can be regarded as one charge retaining unit having a large capacitance. That is, the charge retention capacity can be switched by switching between conductive and non-conductive states of the coupling unit 104.

The coupling unit 104 and others in the drawing include an n-channel MOS transistor. In this n-channel MOS transistor, a drain and a source can be electrically connected by applying a voltage exceeding a threshold value of a gate-source voltage Vgs to a gate. Hereinafter, a voltage exceeding the threshold value of the gate-source voltage Vgs is referred to as an ON voltage. A control signal containing the ON voltage is transmitted by the signal line FDG or others.

The charge transfer unit 102 transfers the charge generated by the photoelectric conversion by the photoelectric conversion unit 101 to the charge retaining unit. The charge transfer unit 102 in the drawing transfers the charge generated by the photoelectric conversion by the photoelectric conversion unit 101 to the first charge retaining unit 121. The charge transfer unit 102 transfers the charge by electrically connecting the photoelectric conversion unit 101 and the first charge retaining unit 121. A control signal for the charge transfer unit 102 is transmitted by the signal line TGL.

The reset unit 103 resets the charge retaining unit. The reset unit 103 in the drawing resets the second charge retaining unit 122. This reset can be performed by discharging the charge of the charge retaining unit by electrically connecting the charge retaining unit and the power supply line Vdd. A control signal for the reset unit 103 is transmitted by the signal line RST.

The image signal generating unit 110 generates an image signal on the basis of the charge retained by the charge retaining unit. As described above, the image signal generating unit 110 includes the MOS transistors 111 and 112. A gate of the MOS transistor 111 is connected to the first charge retaining unit 121. Therefore, an image signal having a voltage corresponding to the charge retained in the first charge retaining unit 121 is generated at a source of the MOS transistor 111. Furthermore, the image signal can be output to the signal line VO by making the MOS transistor 112 conductive. A control signal for the MOS transistor 111 is transmitted by the signal line SEL. The signal line SEL corresponds to a signal line (wiring) that transmits a control signal for the image signal generating unit 110. In addition, the signal line VO corresponds to a signal line (wiring) that transmits an image signal.

As described above, the charge retention capacity can be switched by switching between conductive and non-conductive states of the coupling unit 104. In a case where the coupling unit 104 is non-conductive, the charge generated by the photoelectric conversion unit 101 is transferred only to the first charge retaining unit 121. In this case, since the capacitance of the charge retaining unit is relatively small, a change in the potential in the charge retaining unit with respect to the transferred charge amount is large. On the other hand, in a case where the coupling unit 104 is in a conductive state, the first charge retaining unit 121 and the second charge retaining unit 122 are connected in parallel, and the capacitance of the charge retaining unit increases. Moreover, the charge generated by the photoelectric conversion unit 101 is transferred to the first charge retaining unit 121 and also distributed to and retained in the second charge retaining unit 122. In this case, since the capacitance of the charge retaining unit is relatively large, a change in the potential in the charge retaining unit with respect to the transferred charge amount is small.

As described above, in a case where the coupling unit 104 is non-conductive, the conversion efficiency of the pixel 100 is enhanced. On the other hand, in a case where the coupling unit 104 is conductive, the conversion efficiency of the pixel 100 decreases. Hereinafter, a mode for generating an image signal when the coupling unit 104 is non-conductive is referred to as a high conversion efficiency mode, and a mode for generating an image signal when the coupling unit 104 is conductive is referred to as a low conversion efficiency mode. Note that the low conversion efficiency mode can increase the amount of incident light that causes saturation of an image signal as compared with the high conversion efficiency mode. This is because the charge retention capacity increases.

In one exposure cycle, the conversion efficiency of the pixel 100 can also be switched. The coupling unit 104 is brought into a non-conductive state, and the charge generated by the photoelectric conversion unit 101 is transferred to the first charge retaining unit 121, and an image signal is generated by the image signal generating unit 110. As a result, an image signal in the high conversion efficiency mode can be output. Next, the coupling unit 104 is brought into a conductive state to distribute and retain the charge of the first charge retaining unit 121 to and in the first charge retaining unit 121 and the second charge retaining unit 122. Next, an image signal in the low conversion efficiency mode can be output by generating the image signal again by the image signal generating unit 110. In this manner, an image can be captured with different conversion efficiency, and the dynamic range of the imaging element 1 can be widened. Note that, in a case where the first charge retaining unit 121 is reset, it is necessary to make the reset unit 103 conductive and the coupling unit 104 conductive.

The capacitive coupling wiring 141 is capacitively coupled to the charge retaining unit. The capacitive coupling wiring 141 in the drawing is an example of capacitive coupling with wiring (node) connected to the second charge retaining unit 122. The capacitor 129 corresponds to a coupling capacitor. Furthermore, the capacitive coupling wiring 141 includes wiring different from signal lines (wiring), which transmit a control signal to an element included in the pixel 100 such as the signal line TGL, the signal line RST, the signal line FDG, and the signal line SEL, and a signal line (wiring) that transmits a signal from the pixel 100 such as the signal line VO. That is, the capacitive coupling wiring 141 is in a floating state with respect to other signal lines.

The potential of a destination of the capacitive coupling can be adjusted by adjusting the voltage of a signal applied to the capacitive coupling wiring 141. When a voltage is applied to the capacitive coupling wiring 141, the applied voltage is divided and supplied depending on the capacitances of the capacitor 129 and the second charge retaining unit 122, which can change the potential of the wiring (node) connected to the second charge retaining unit 122. For example, by applying a signal having a voltage higher than that in a steady state to the capacitive coupling wiring 141, the potential of the charge retaining unit can be increased. In this case, the potential of the charge retaining unit is deep, and retention capacity of a charge (electrons) can be increased. It is possible to prevent an overflow in which a charge retained in the charge retaining unit overflows. The vertical drive unit 20 in the drawing outputs an adjustment signal via the capacitive coupling wiring 141 and the coupling capacitor to adjust the potential of the charge retaining unit. Note that the vertical drive unit 20 is an example of a potential adjustment unit described in the claims.

The capacitor 129 corresponds to a stray capacitance between the capacitive coupling wiring 141 and the wiring (node) included in the charge retaining unit. That is, the capacitor 129 is not an element formed in the pixel 100 but is a capacitor including a so-called parasitic capacitance or a stray capacitance.

[Structure of Cross-Section of Pixel]

Figure 3:
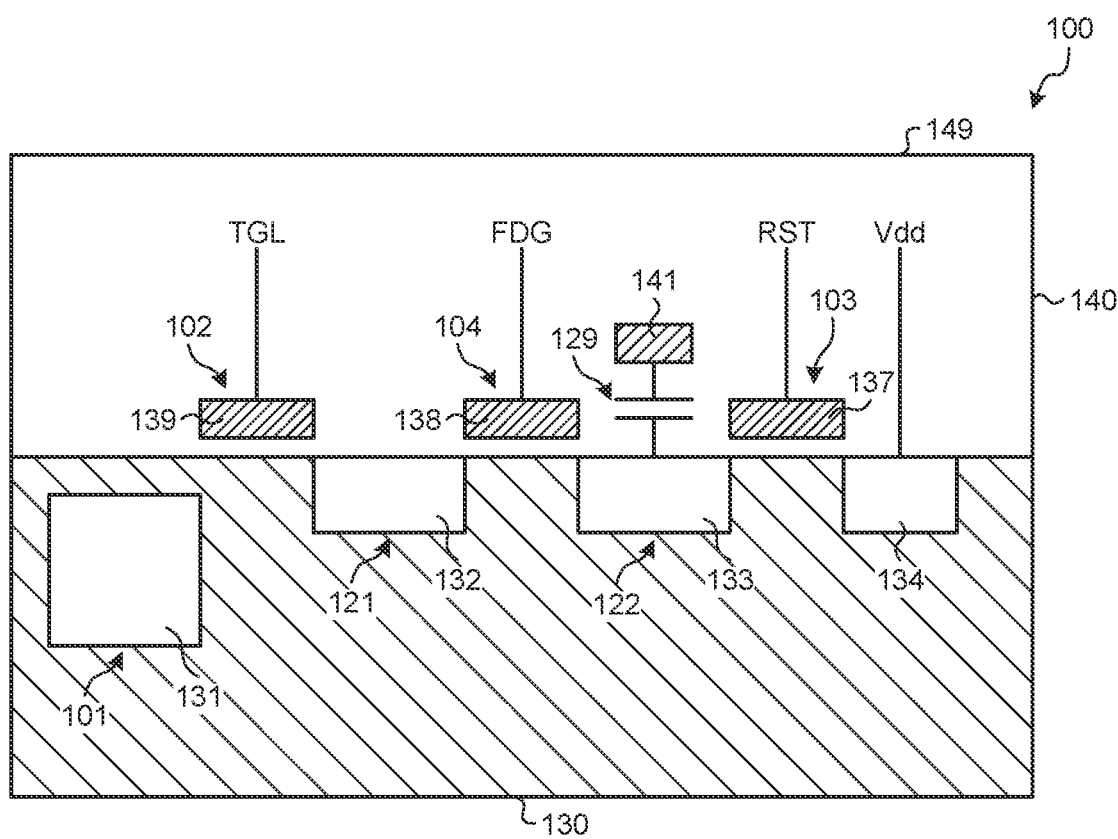
FIG. 3 is a cross-sectional view illustrating a structure example of a pixel according to the first embodiment of the disclosure.

FIG. 3 is a cross-sectional view illustrating a configuration example of a pixel according to the first embodiment of the disclosure. The drawing is a diagram illustrating a simplified structure of a cross section of the pixel 100 and is a diagram schematically illustrating a part of the pixel 100. In the drawing, the semiconductor substrate 130 and a wiring region 140 included in the pixel 100 are illustrated.

The semiconductor substrate 130 is a semiconductor substrate on which elements of the pixel 100 are formed. The semiconductor substrate 130 can be made of silicon (Si). In the drawing, among the elements included in the pixel 100, the photoelectric conversion unit 101, the charge transfer unit 102, the first charge retaining unit 121, the coupling unit 104, the second charge retaining unit 122, and the reset unit 103 are illustrated. For convenience, it is based on the premise that the semiconductor substrate 130 in the drawing includes a p-type well region. A white rectangle illustrated in the semiconductor substrate 130 represents an n-type semiconductor region. In the drawing, n-type semiconductor regions 131 to 134 are illustrated.

The photoelectric conversion unit 101 includes an n-type semiconductor region 131. Specifically, a photodiode including a p-n junction at an interface between the n-type semiconductor region 131 and a surrounding p-type well region corresponds to the photoelectric conversion unit 101. In the photoelectric conversion unit 101, electrons of charges generated by photoelectric conversion are accumulated in the n-type semiconductor region 131 and transferred by the charge transfer unit 102.

The first charge retaining unit 121 and the second charge retaining unit 122 include an n-type semiconductor region 132 and an n-type semiconductor region 133, respectively. The n-type semiconductor region 132 and the n-type semiconductor region 133 correspond to the above-described FD.

Gates 137 to 139 included in the MOS transistors are arranged adjacent to the semiconductor substrate 130. Note that a gate insulating film is disposed between the gates 137 to 139 and the semiconductor substrate 130.

The charge transfer unit 102 includes the n-type semiconductor region 131, the n-type semiconductor region 132, and the gate 139. The coupling unit 104 includes the n-type semiconductor region 132, the n-type semiconductor region 133, and the gate 138. The reset unit 103 includes the n-type semiconductor region 133, the n-type semiconductor region 134, and the gate 137. As described above, the signal line RST, the signal line FDG, and the signal line TGL are connected to the gates 137 to 139, respectively.

The wiring region 140 includes wiring that transmits a signal to the elements and an insulating layer 149 that insulates wiring from wiring. In the wiring region 140 of the drawing, the capacitive coupling wiring 141 is illustrated as wiring. The wiring such as the capacitive coupling wiring 141 can be made of metal such as copper (Cu). Furthermore, the insulating layer 149 can include an insulator such as silicon oxide ($SiO_2$).

As illustrated in the drawing, the capacitive coupling wiring 141 can be disposed in the vicinity of the n-type semiconductor region 133 included in the second charge retaining unit 122 and can form the capacitor 129 that is a floating capacitance together with the n-type semiconductor region 133. The n-type semiconductor region 133 corresponds to a drain region of the MOS transistor included in the coupling unit 104 and corresponds to a source region of the MOS transistor included in the reset unit 103. By applying an adjustment signal to the capacitive coupling wiring 141, the potential of the n-type semiconductor region 133 included in the second charge retaining unit 122 can be adjusted via the capacitor 129.

[Another Structure of Cross-Section of Pixel]

Figure 4:
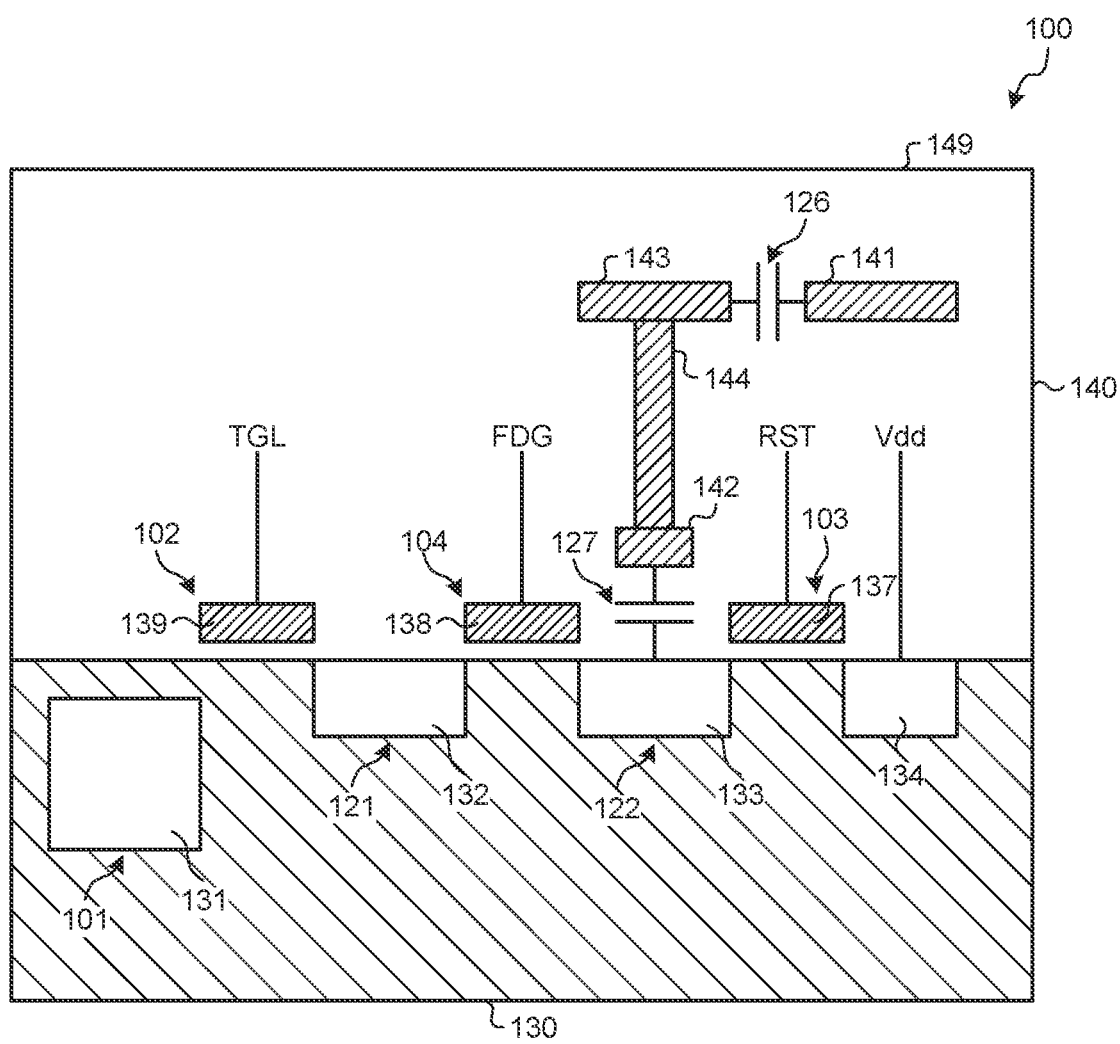
FIG. 4 is a cross-sectional view illustrating another structure example of a pixel according to the first embodiment of the disclosure.

FIG. 4 is a cross-sectional view illustrating another configuration example of a pixel according to the first embodiment of the disclosure. The pixel 100 in the drawing is different from the pixel 100 in FIG. 3 in that a plurality of pieces of wiring are stacked in the wiring region 140. Wiring 142 and wiring 143 are further arranged in the wiring region 140 in the drawing. The wiring 142 is arranged in the lowermost layer of the wiring region 140 and is arranged in a layer closest to the semiconductor substrate 130. The capacitive coupling wiring 141 and the wiring 143 are arranged in the same layer but in a layer different from that of the wiring 142. Note that the structure of the wiring region 140 is not limited to this example. For example, three or more layers of wiring can be laminated.

The pieces of wiring arranged in different layers can be connected by a via plug. The wiring 142 and the wiring 143 are connected by a via plug 144. The capacitive coupling wiring 141 and the wiring 143 in the drawing are connected by a capacitor 126 including a stray capacitance. The wiring 142 and the second charge retaining unit 122 are connected by a capacitor 127 including a stray capacitance. That is, the capacitive coupling wiring 141 in the drawing is coupled to the second charge retaining unit 122 via the two capacitors 126 and 127 connected in series. Since the adjustment voltage is applied via the capacitors 126 and 127 connected in series, the voltage applied to the second charge retaining unit 122 decreases. However, the capacitive coupling wiring 141 can be disposed in an upper layer of the wiring region 140, and the degree of freedom in the arrangement of the capacitive coupling wiring 141 in the pixel 100 can be improved.

[Configuration of Capacitive Coupling Wiring]

Figure 5:
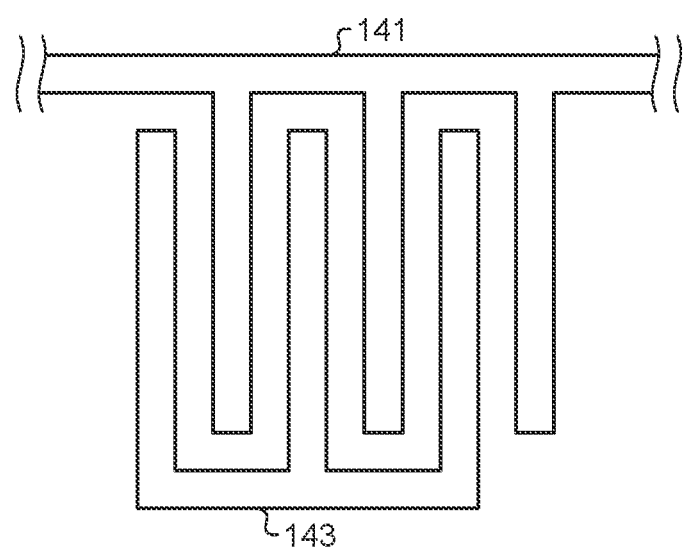
FIG. 5 is a diagram illustrating a structure example of capacitive coupling wiring according to the first embodiment of the disclosure.

FIG. 5 is a diagram illustrating a structure example of the capacitive coupling wiring according to the first embodiment of the disclosure. The drawing is a plan view illustrating a configuration example of the capacitive coupling wiring 141. As described with reference to FIG. 4, the capacitive coupling wiring 141 and the wiring 143 are arranged in the same layer. As illustrated in the drawing, the capacitive coupling wiring 141 and the wiring 143 can be formed in a comb shape in a plan view and be arranged close to each other. As a result, the static capacity of the capacitor 126 between the capacitive coupling wiring 141 and the wiring 143 can be increased. It is possible to increase the adjustment voltage divided and distributed to the capacitor 127 among the capacitors 126 and 127 connected in series. Note that the capacitive coupling wiring 141 can be disposed arranged in a shared manner for a plurality of pixels 100 in a row of the pixel array unit 10 described in FIG. 1.

[Generation of Image Signal]

Figure 6:
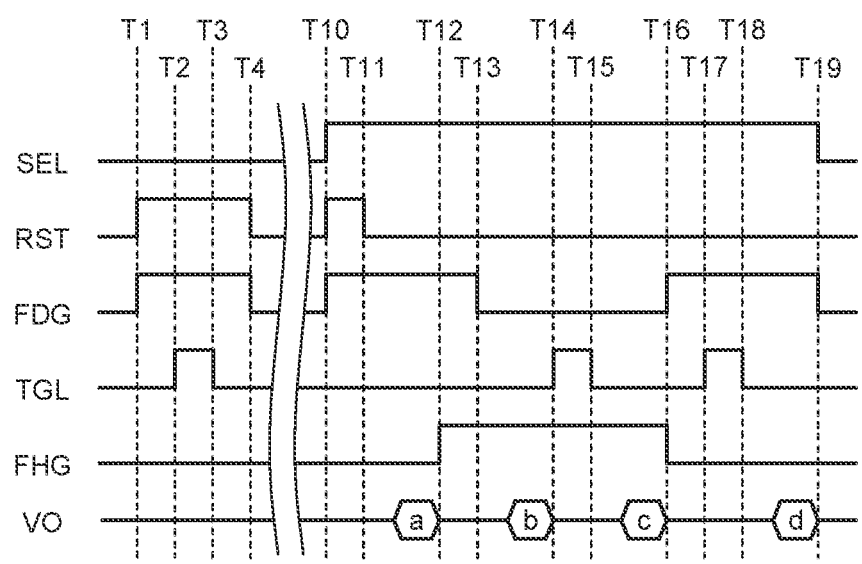
FIG. 6 is a diagram illustrating an example of generation of image signals according to the first embodiment of the disclosure.

FIG. 6 is a diagram illustrating an example of generation of image signals according to the first embodiment of the disclosure. The drawing is a timing chart illustrating an example of generation of image signals in a pixel 100. "SEL", "RST", "FDG", and "TGL" in the drawing represent control signals of the signal line SEL, the signal line RST, the signal line FDG, and the signal line TGL, respectively. Meanwhile, "FHG" represents an adjustment signal of the capacitive coupling wiring 141. In the drawing, these signals are illustrated by binarized waveforms. A value "0" of the waveform in the drawing represents a control signal or the like on the low-voltage side. This voltage corresponds to the gate-source voltage Vgs that brings the MOS transistor 111 and others into a non-conductive state, and for example, 0 V or a negative voltage can be applied. Note that the control signal on the low-voltage side of the signal line SEL or others corresponding to the value "0" and the signal on the low-voltage side of the capacitive coupling wiring 141 can have different values. For convenience, these control signals and others on the low voltage side are represented by the value "0". The same applies to other drawings subsequent to FIG. 6 as well.

A part of a value "1" represents a control signal or others on the high voltage side. In the signal line SEL, the signal line RST, the signal line FDG, and the signal line TGL, the part of the value "1" represents an ON voltage. In the capacitive coupling wiring 141, the part having the value "1" represents the adjustment voltage. In addition, "VO" in the drawing represents a signal output to the signal line VO.

In the initial state, the voltages of the signal line SEL, the signal line RST, the signal line FDG, the signal line TGL, and the capacitive coupling wiring 141 are, for example, 0 V.

Next, at T1, the ON voltage is applied to the signal line RST and the signal line FDG, and the reset unit 103 and the coupling unit 104 are electrically conducted. As a result, the first charge retaining unit 121 and the second charge retaining unit 122 are reset. Note that the application of the ON voltage to the signal line RST and the signal line FDG continues until T4.

Next, at T2, the ON voltage is applied to the signal line TGL, and the charge transfer unit 102 is made conductive. As a result, the charge in the photoelectric conversion unit 101 is discharged and reset.

Next, at T3, the application of the ON voltage to the signal line TGL is stopped, and the charge transfer unit 102 is brought into a non-conductive state. Next, at T4, the application of the ON voltage to the signal line RST and the signal line FDG is stopped, and the reset unit 103 and the coupling unit 104 are brought into a non-conductive state.

By the operations at T1 to T4, the pixel 100 is reset. Then, an exposure period for accumulating charges generated by the photoelectric conversion unit 101 is started.

After a predetermined exposure period has elapsed, at T10, the ON voltage is applied to the signal line RST and the signal line FDG, the reset unit 103 and the coupling unit 104 are brought into a conductive state, and the first charge retaining unit 121 and the second charge retaining unit 122 are reset again. The image signal generating unit 110 generates an image signal at the time of reset. In addition, the ON voltage is applied to the signal line SEL to make the MOS transistor 112 conductive, and the image signal is output to the signal line VO. Note that the application of the ON voltage to the signal line SEL and the signal line FDG continues until T19 and T13, respectively.

Next, at T11, the application of the ON voltage to the signal line RST is stopped. Then, a signal output to the signal line VO in a period up to T12 is retained in the column signal processing unit 30 described in FIG. 1 as an image signal "a" at the time of reset (hereinafter referred to as a reset signal "a"). Note that the signal output to the signal line VO is converted into a digital signal and retained in the column signal processing unit 30. Since the coupling unit 104 is in a conductive state, the reset signal "a" is in the low conversion efficiency mode.

Next, at T12, the adjustment voltage is applied to the capacitive coupling wiring 141 (FHG), and the potential of the second charge retaining unit 122 capacitively coupled to the capacitive coupling wiring 141 rises. At this time, since the coupling unit 104 is in a conductive state, the potential of the first charge retaining unit 121 similarly rises. As a result, the potentials of the first charge retaining unit 121 and the second charge retaining unit 122 become deep. Note that the application of the adjustment voltage to the capacitive coupling wiring 141 (FHG) continues until T16.

Next, at T13, the application of the ON voltage to the signal line FDG is stopped. Then, a signal output to the signal line VO in a period up to T14 is retained in the column signal processing unit 30 as an image signal "b" at the time of reset (hereinafter referred to as a reset signal "b"). Since the coupling unit 104 is in the non-conductive state, the reset signal "b" is in the high conversion efficiency mode.

Next, at T14, the ON voltage is applied to the signal line TGL, and the charge transfer unit 102 is made conductive. The charge generated and retained in the photoelectric conversion unit 101 during the exposure period is transferred to the first charge retaining unit 121.

Next, at T15, the application of the ON voltage to the signal line TGL is stopped, and the charge transfer unit 102 is brought into a non-conductive state. Then, a signal output to the signal line VO in a period up to T16 is retained in the column signal processing unit 30 as an image signal "c". Since the coupling unit 104 is in the non-conductive state, the image signal "c" is in the high conversion efficiency mode.

Next, at T16, an ON voltage is applied to the signal line FDG. With the coupling unit 104 made conductive, the charge retained in the first charge retaining unit 121 is distributed to the first charge retaining unit 121 and the second charge retaining unit 122. In addition, the application of the adjustment voltage to the capacitive coupling wiring 141 (FHG) is stopped. Note that the application of the ON voltage to the signal line FDG continues until T19.

Next, at T17, the ON voltage is applied to the signal line TGL, and the charge transfer unit 102 is made conductive again. The charge generated and retained in the photoelectric conversion unit 101 during a period from T15 to T17 is transferred to the first charge retaining unit 121.

Next, at T18, the application of the ON voltage to the signal line TGL is stopped, and the charge transfer unit 102 is brought into a non-conductive state. Then, a signal output to the signal line VO in a period up to T19 is retained in the column signal processing unit 30 as an image signal "d". Since the coupling unit 104 is in the conductive state, the image signal "d" is in the low conversion efficiency mode.

By the above operation, the reset signal "a" and the image signal "d" in the low conversion efficiency mode and the reset signal "b" and the image signal "c" in the high conversion efficiency mode are generated and retained in the column signal processing unit 30. Thereafter, the column signal processing unit 30 executes CDS in each of the low conversion efficiency mode and the high conversion efficiency mode. Specifically, the column signal processing unit 30 subtracts the reset signal "a" from the image signal "d" to remove an offset error of the image signal in the low conversion efficiency mode. In addition, the column signal processing unit 30 subtracts the reset signal "b" from the image signal "c" to remove an offset error of the image signal in the high conversion efficiency mode.

At the above-described T13, the application of the ON voltage to the signal line FDG is stopped, and the coupling unit 104 is brought into a non-conductive state. At this point, the potential of the first charge retaining unit 121 becomes shallow. This is because the application of the ON voltage to a gate of the coupling unit 104 is stopped. As a result, transfer of charges from the photoelectric conversion unit 101 to the first charge retaining unit 121 by the charge transfer unit 102 is hindered. Specifically, all the charges retained in the photoelectric conversion unit 101 are not transferred to the first charge retaining unit 121, thereby allowing some charges to remain in the photoelectric conversion unit 101. Therefore, errors in image signals increase.

However, at T12, by applying an adjustment signal of a relatively high voltage to the capacitive coupling wiring 141 to increase the potential of the charge retaining unit, the potential of the first charge retaining unit 121 can be made deeper than that in the steady state. As a result, it is possible to compensate for an increase in the potential when the coupling unit 104 transitions to a non-conductive state, and it is possible to improve the charge transfer efficiency. Therefore, it is possible to completely transfer all the charges of the photoelectric conversion unit 101 to the first charge retaining unit 121.

[Another Structure of Pixel]

Figure 7:
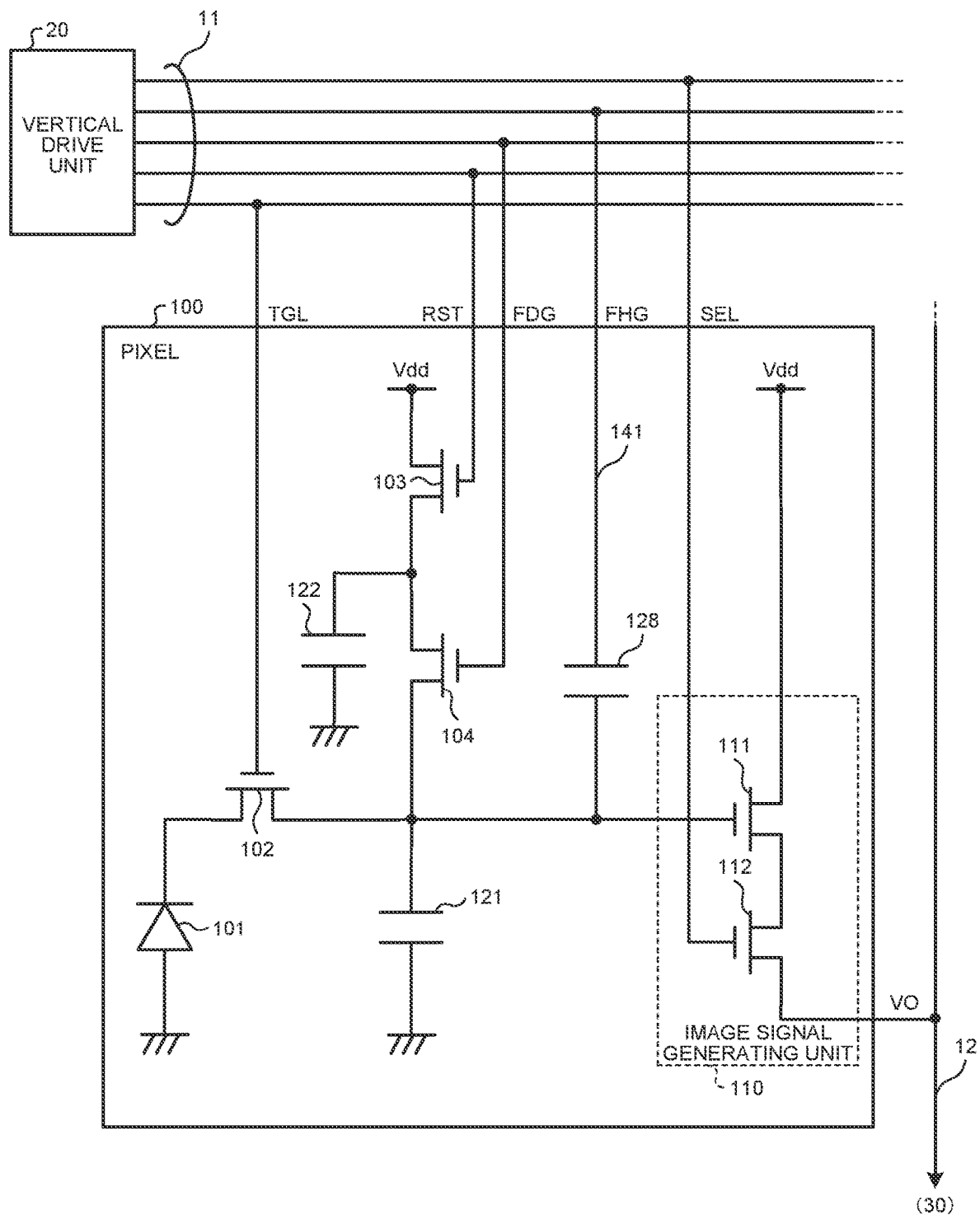
FIG. 7 is a diagram illustrating another configuration example of a pixel according to the first embodiment of the disclosure.

FIG. 7 is a diagram illustrating another configuration example of a pixel according to the first embodiment of the disclosure. The drawing is a circuit diagram illustrating a configuration example of a pixel 100 similarly to FIG. 2. The pixel 100 in the drawing is different from the pixel 100 in FIG. 2 in that capacitive coupling wiring 141 is capacitively coupled to a first charge retaining unit 121.

The capacitive coupling wiring 141 in the drawing is connected to wiring (node) connected to the first charge retaining unit 121 via a capacitor 128. Describing with a reference to the cross-sectional view of FIG. 3, the capacitive coupling wiring 141 is arranged in the vicinity of an n-type semiconductor region 132 included in the first charge retaining unit 121. A stray capacitance between the capacitive coupling wiring 141 and the n-type semiconductor region 132 corresponds to the capacitor 128.

[Another Example of Image Signal Generation]

Figure 8:
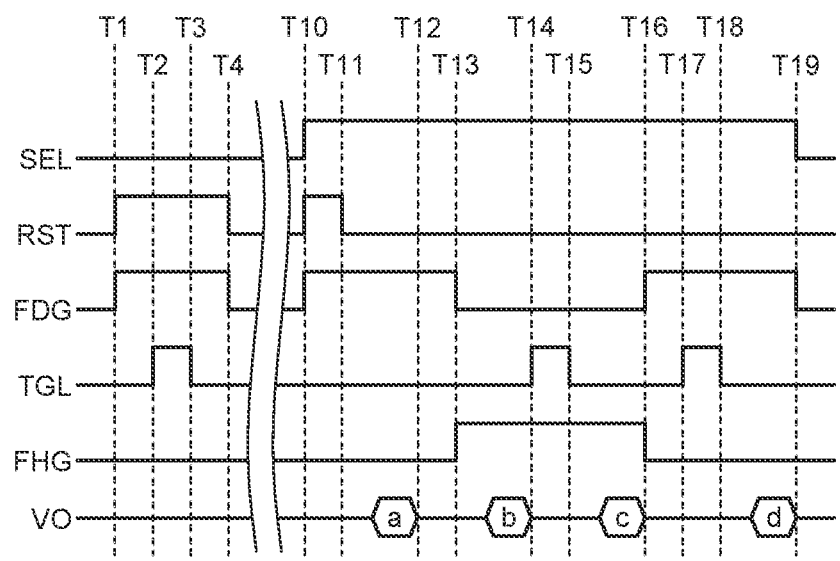
FIG. 8 is a diagram illustrating another example of generation of image signals according to the first embodiment of the disclosure.

FIG. 8 is a diagram illustrating another example of generation of image signals according to the first embodiment of the disclosure. The drawing is a timing chart illustrating an example of generation of image signals in the pixel 100 in FIG. 7. The drawing is different from the timing chart in FIG. 6 in the timing of applying an adjustment potential to the capacitive coupling wiring 141 (FHG).

At T13, application of the ON voltage to the signal line FDG is stopped, and the adjustment voltage is applied to the capacitive coupling wiring 141 (FHG). The application of the adjustment voltage to the capacitive coupling wiring 141 (FHG) continues until T16.

As described above, the adjustment voltage is applied to the capacitive coupling wiring 141 (FHG) when the coupling unit 104 is in the non-conductive state. As a result, the potential of the first charge retaining unit 121 rises. The charge retention capacity of the first charge retaining unit 121 can be increased. On the other hand, no adjustment voltage is applied to the second charge retaining unit 122. The potential of the second charge retaining unit 122 is maintained at a low state. By adopting a configuration in which the capacitive coupling wiring 141 is capacitively coupled to the first charge retaining unit 121, only the potential of the first charge retaining unit 121 can be selectively adjusted. It is possible to reduce occurrence of white spots described later in FIG. 16. Note that the generation procedure of image signals described in FIG. 6 can also be applied to the pixel 100 in FIG. 7.

As described above, the potential of the charge retaining unit can be compensated by applying the adjustment signal to the charge retaining unit. The adjustment signal is transmitted by the capacitive coupling wiring 141 different from the signal lines that transmit control signals and the like. Therefore, the adjustment signal can be transmitted to the pixel 100 without being affected by the control signals of the pixel 100. Therefore, even in a case of performing complicated control such as switching the conversion efficiency, the adjustment signal can be transmitted to the pixel 100 and applied to the charge retaining unit.

2. Second Embodiment

In the imaging element 1 of the first embodiment described above, a photoelectric conversion unit 101 is arranged in a pixel 100. Meanwhile, an imaging element 1 according to a second embodiment of the present disclosure is different from the first embodiment in that a plurality of photoelectric conversion units is arranged.

[Configuration of Pixel]

Figure 9:
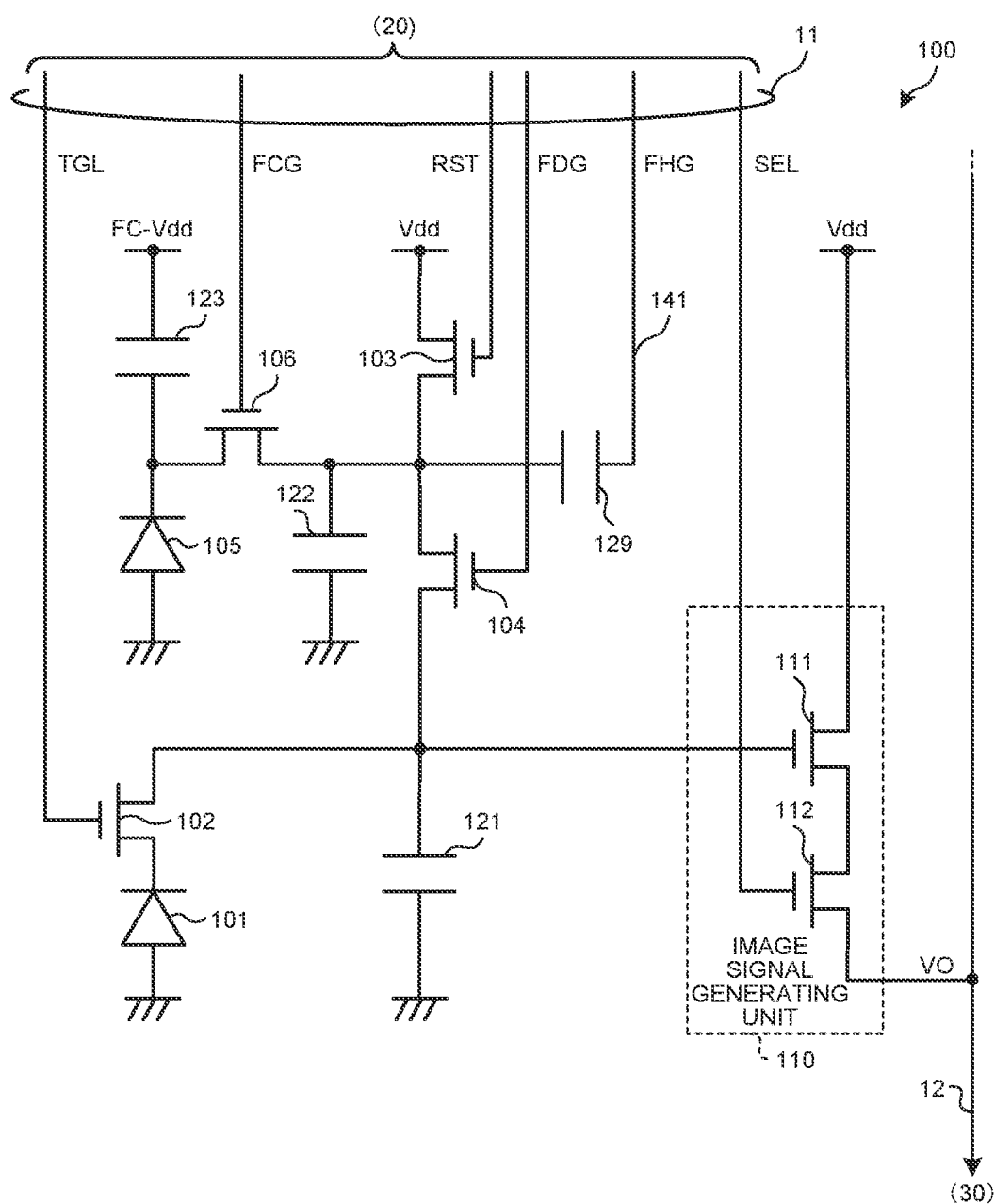
FIG. 9 is a diagram illustrating a configuration example of a pixel according to a second embodiment of the disclosure.

FIG. 9 is a diagram illustrating a configuration example of a pixel according to the second embodiment of the disclosure. The drawing is a circuit diagram illustrating a configuration example of a pixel 100 similarly to FIG. 2. The pixel 100 is different from the pixel in FIG. 2 in further including a second photoelectric conversion unit 105, a second charge transfer unit 106, and a third charge retaining unit 123. In addition, signal lines 11 in the drawing further includes a signal line FCG, and a power supply line FC-Vdd is further wired to the pixel 100. For convenience, the illustration of the pixel 100 in the drawing is simplified.

An anode of the second photoelectric conversion unit 105 is grounded, and a cathode is connected to a source of the second charge transfer unit 106 and a first end of the third charge retaining unit 123. A second end of the third charge retaining unit 123 is connected to a power supply line FC-Vdd. A drain of the second charge transfer unit 106 is connected to a first end of the second charge retaining unit 122, a source of a reset unit 103, a drain of a coupling unit 104, and a first end of a capacitor 129. A gate of the second charge transfer unit 106 is connected to the signal line FCG. Since other connections are similar to those of the pixel 100 in FIG. 2, description thereof will be omitted.

Similarly to a photoelectric conversion unit 101, the second photoelectric conversion unit 105 performs photoelectric conversion of incident light. The second photoelectric conversion unit 105 can be configured to have a sensitivity different from that of the photoelectric conversion unit 101. For example, an element having a lower sensitivity than that of the photoelectric conversion unit 101 can be used for the second photoelectric conversion unit 105. Specifically, a photodiode having a smaller light receiving area than that of the photoelectric conversion unit 101 can be used as the second photoelectric conversion unit 105.

The third charge retaining unit 123 retains a charge generated by the second photoelectric conversion unit 105. The third charge retaining unit 123 can include, for example, a metal insulator semiconductor (MIS) capacitor using a static capacity between the semiconductor substrate 130 and an electrode arranged in the wiring region 140 as a capacitor.

The second charge transfer unit 106 transfers the charge retained in the third charge retaining unit 123 to the second charge retaining unit 122. A control signal for the second charge transfer unit 106 is transmitted by the signal line FCG. An n-channel MOS transistor can be used for the second charge transfer unit 106.

Note that the capacitive coupling wiring 141 includes wiring different from signal lines TGL, RST, FDG, SEL, VO, and FCG.

By disposing the second photoelectric conversion unit 105 and generating an image signal using the image signal generating unit 110, it is possible to output an image signal with low sensitivity. Hereinafter, a mode for generating an image signal of the second photoelectric conversion unit 105 is referred to as a low-sensitivity mode. The pixel 100 in the drawing can perform three types of imaging including the high conversion efficiency mode, the low conversion efficiency mode, and the low-sensitivity mode.

[Generation of Image Signal]

Figure 10:
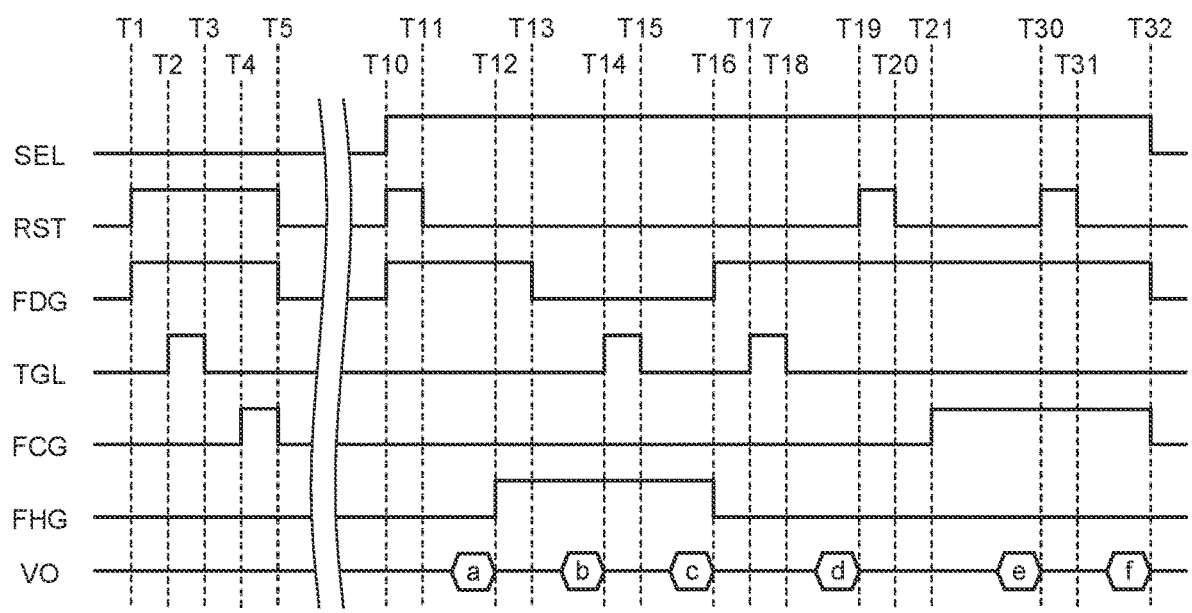
FIG. 10 is a diagram illustrating an example of generation of image signals according to the second embodiment of the disclosure.

FIG. 10 is a diagram illustrating an example of generation of image signals according to the second embodiment of the disclosure. The drawing is a timing chart illustrating an example of generation of image signals in the pixel 100, similarly to FIG. 6. A generation procedure in the drawing is different from that in FIG. 6 in that a control signal of the signal line FCG is added and that a generation procedure of an image signal due to the second photoelectric conversion unit 105 is added. In the drawing, "FCG" represents a control signal of the signal line FCG. Parts different from the generation procedure of FIG. 6 will be described.

During a period from T4 to T5, application of ON voltages to the signal line RST and the signal line FDG is extended. In addition, the ON voltage is applied to the signal line FCG, and the second charge transfer unit 106 is made conductive. As a result, the third charge retaining unit 123 is reset.

At T19, the ON voltage is applied to the signal line RST, and the reset unit 103 is made conductive. Since the coupling unit 104 is in a conductive state, the first charge retaining unit 121 and the second charge retaining unit 122 are reset. Note that application of the ON voltage to the signal line SEL is extended to a period from T10 to T32.

Next, at T20, the application of the ON voltage to the signal line RST is stopped.

Next, at T21, the ON voltage is applied to the signal line FCG, and the second charge transfer unit 106 is made conductive. As a result, the charges retained in the second photoelectric conversion unit 105 and the third charge retaining unit 123 are transferred to the first charge retaining unit 121 and the second charge retaining unit 122. Then, a signal output to the signal line VO in a period up to T30 is retained in a column signal processing unit 30 as an image signal "e". The image signal "e" is in the low-sensitivity mode.

Next, at T30, the ON voltage is applied to the signal line RST, and the reset unit 103 is made conductive. Since the coupling unit 104 and the second charge transfer unit 106 are in the conductive state, the first charge retaining unit 121, the second charge retaining unit 122, and the third charge retaining unit 123 are reset.

Next, at T31, the application of the ON voltage to the signal line RST is stopped. Then, a signal output to the signal line VO in a period up to T32 is retained in the column signal processing unit 30 as an image signal "f" at the time of reset (hereinafter referred to as a reset signal "f"). The reset signal "f" is in the low-sensitivity mode.

By the above operation, the reset signal "f" and the image signal "e" in the low-sensitivity mode are further generated and retained in the column signal processing unit 30. Then, the column signal processing unit 30 executes CDS in the low-sensitivity mode. Specifically, the column signal processing unit 30 subtracts the reset signal "f" from the image signal "e" to remove an offset error of the image signal in the low-sensitivity mode.

[Another Structure of Pixel]

Figure 11:
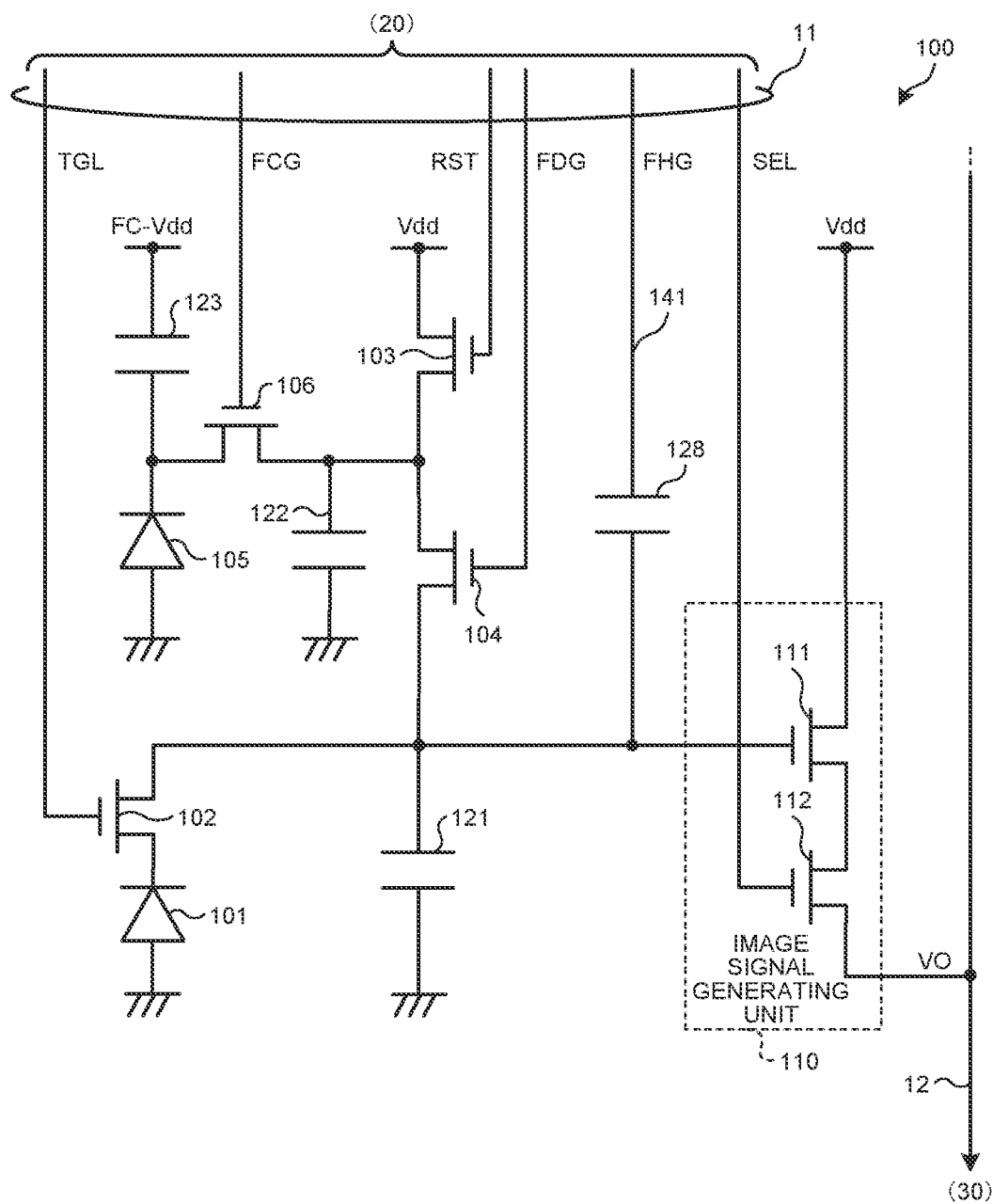
FIG. 11 is a diagram illustrating another configuration example of a pixel according to the second embodiment of the disclosure.

FIG. 11 is a diagram illustrating another configuration example of a pixel according to the second embodiment of the disclosure. The drawing is a circuit diagram illustrating a configuration example of a pixel 100 similarly to FIG. 10. The pixel 100 in the drawing is different from the pixel 100 in FIG. 10 in that capacitive coupling wiring 141 is coupled to a first charge retaining unit 121.

The capacitive coupling wiring 141 in the drawing is connected to wiring (node) connected to the first charge retaining unit 121 via a capacitor 128. Similarly to the pixel 100 in FIG. 10, the potential of the charge retaining unit can be adjusted.

Note that the capacitive coupling wiring 141 may be configured to be capacitively coupled to a third charge retaining unit 123.

The configuration of the imaging element 1 other than the above is similar to the configuration of the imaging element 1 in the first embodiment of the present disclosure, and thus description thereof is omitted.

As described above, the imaging element 1 according to the second embodiment of the present disclosure includes the second photoelectric conversion unit 105 and further generates an image signal in the low-sensitivity mode. Also in this case, when an image signal in the high conversion efficiency mode is generated, the potential of the charge retaining unit can be adjusted by the capacitive coupling wiring 141.

3. Third Embodiment

In the imaging element 1 of the second embodiment described above, the second photoelectric conversion unit 105 and the third charge retaining unit 123 are arranged in the pixel 100. Meanwhile, an imaging element 1 according to a third embodiment of the present disclosure is different from the above-described second embodiment in further including a transfer unit that transfers a charge of a second photoelectric conversion unit 105 to a third charge retaining unit 123.

[Configuration of Imaging Element]

Figure 12:
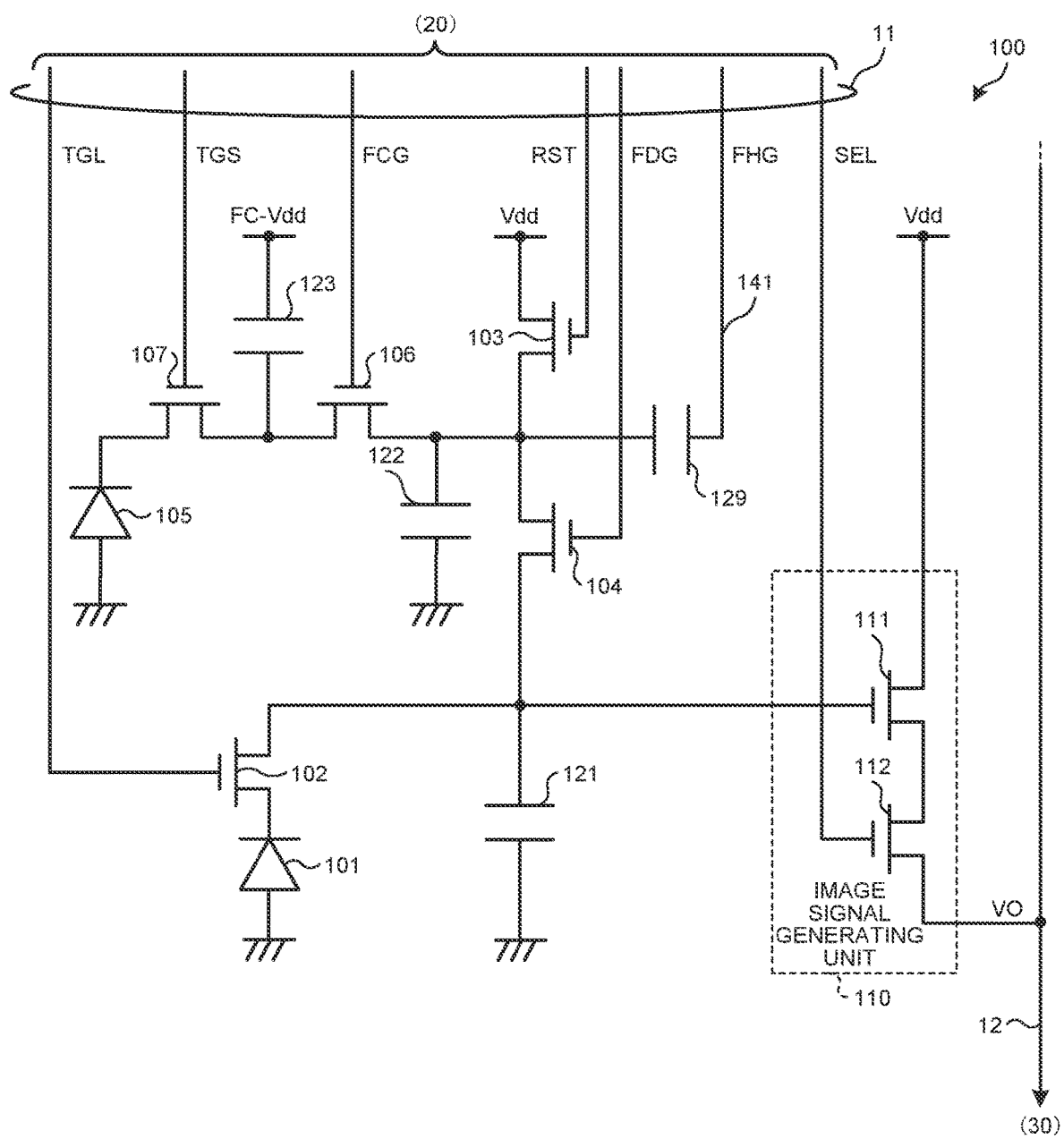
FIG. 12 is a diagram illustrating a configuration example of a pixel according to a third embodiment of the disclosure.

FIG. 12 is a diagram illustrating a configuration example of a pixel according to the third embodiment of the disclosure. The drawing is a circuit diagram illustrating a configuration example of a pixel 100 similarly to FIG. 9. The pixel 100 in the drawing is different from the pixel 100 in FIG. 9 in that a third charge transfer unit 107 is disposed between a second photoelectric conversion unit 105 and a third charge retaining unit 123 and that a signal line TGS is further included in the signal lines 11.

An anode of the second photoelectric conversion unit 105 is connected to a source of the third charge transfer unit 107, and a drain of the third charge transfer unit 107 is connected to a source of a second charge transfer unit 106 and a first end of the third charge retaining unit 123. A gate of the third charge transfer unit 107 is connected to the signal line TGS.

The third charge transfer unit 107 transfers a charge generated by the second photoelectric conversion unit 105 to the third charge retaining unit 123. A control signal for the third charge transfer unit 107 is transmitted by the signal line TGS. An n-channel MOS transistor can be used for the third charge transfer unit 107. Note that, in the third charge transfer unit 107, an overflow path for transferring a charge having overflowed from the second photoelectric conversion unit 105 to the third charge retaining unit 123 can be formed. This overflow path can be formed by deepening the potential immediately below a gate electrode of the third charge transfer unit 107.

Note that the capacitive coupling wiring 141 includes wiring different from signal lines TGL, RST, FDG, SEL, FCG, VO, and TGS.

[Generation of Image Signal]

Figure 13:
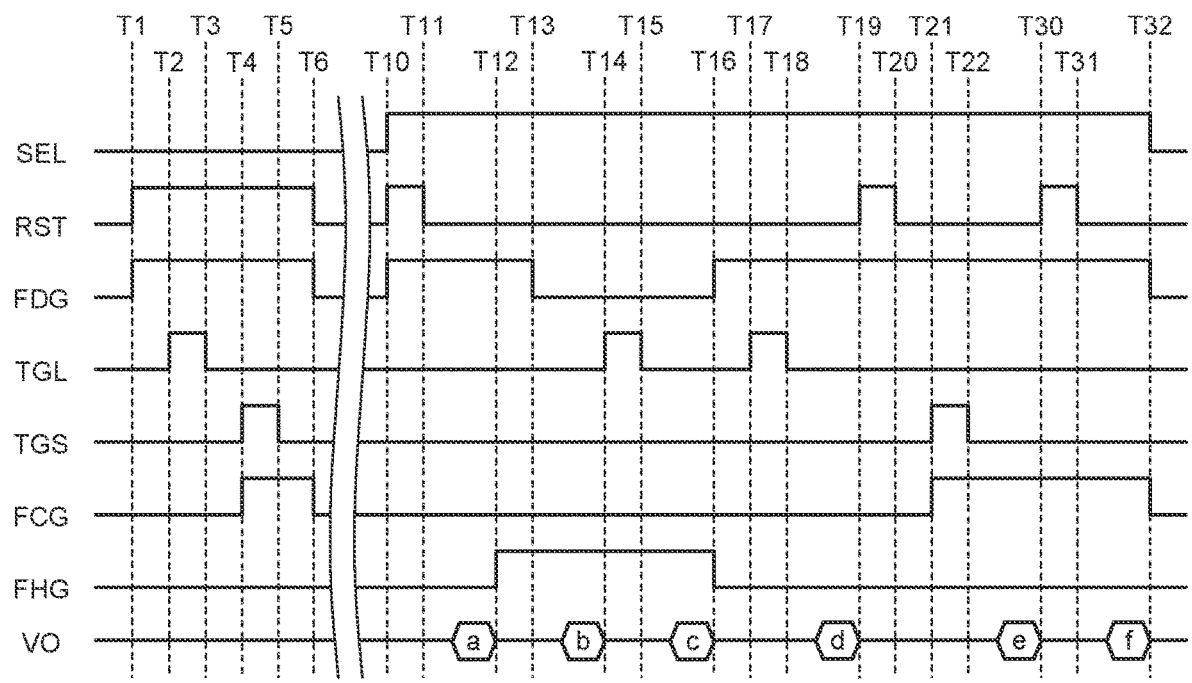
FIG. 13 is a diagram illustrating an example of generation of image signals according to the third embodiment of the disclosure.

FIG. 13 is a diagram illustrating an example of generation of image signals according to the third embodiment of the disclosure. The drawing is a timing chart illustrating an example of generation of image signals in the pixel 100, similarly to FIG. 10. The generation procedure in the drawing is different from that in FIG. 10 in that a control signal of the signal line TGS is added. In the drawing, "TGS" represents the control signal of the signal line TGS. Parts different from the generation procedure of FIG. 10 will be described.

At T4, the ON voltage is applied to the signal line TGS and the signal line FCG. As a result, the second photoelectric conversion unit 105 is reset.

Next, at T5, the application of the ON voltage to the signal line TGS is stopped. Note that the application of the ON voltage to the signal line RST, the signal line FDG, and the signal line FCG is extended to T6.

Next, at T6, the application of the ON voltage to the signal line RST, the signal line FDG, and the signal line FCG is stopped.

At T21, the ON voltage is applied to the signal line TGS, and the third charge transfer unit 107 is made conductive. Since the second charge transfer unit 106 and the coupling unit 104 are in the conductive state, the charge generated by the second photoelectric conversion unit 105 and the charge retained in the third charge retaining unit 123 are transferred to the first charge retaining unit 121 and the second charge retaining unit 122.

Next, at T22, the application of the ON voltage to the signal line TGS is stopped. Then, a signal output to the signal line VO in a period up to T30 is retained in a column signal processing unit 30 as an image signal "e". The image signal "e" is in the low-sensitivity mode.

[Another Structure of Pixel]

Figure 14:
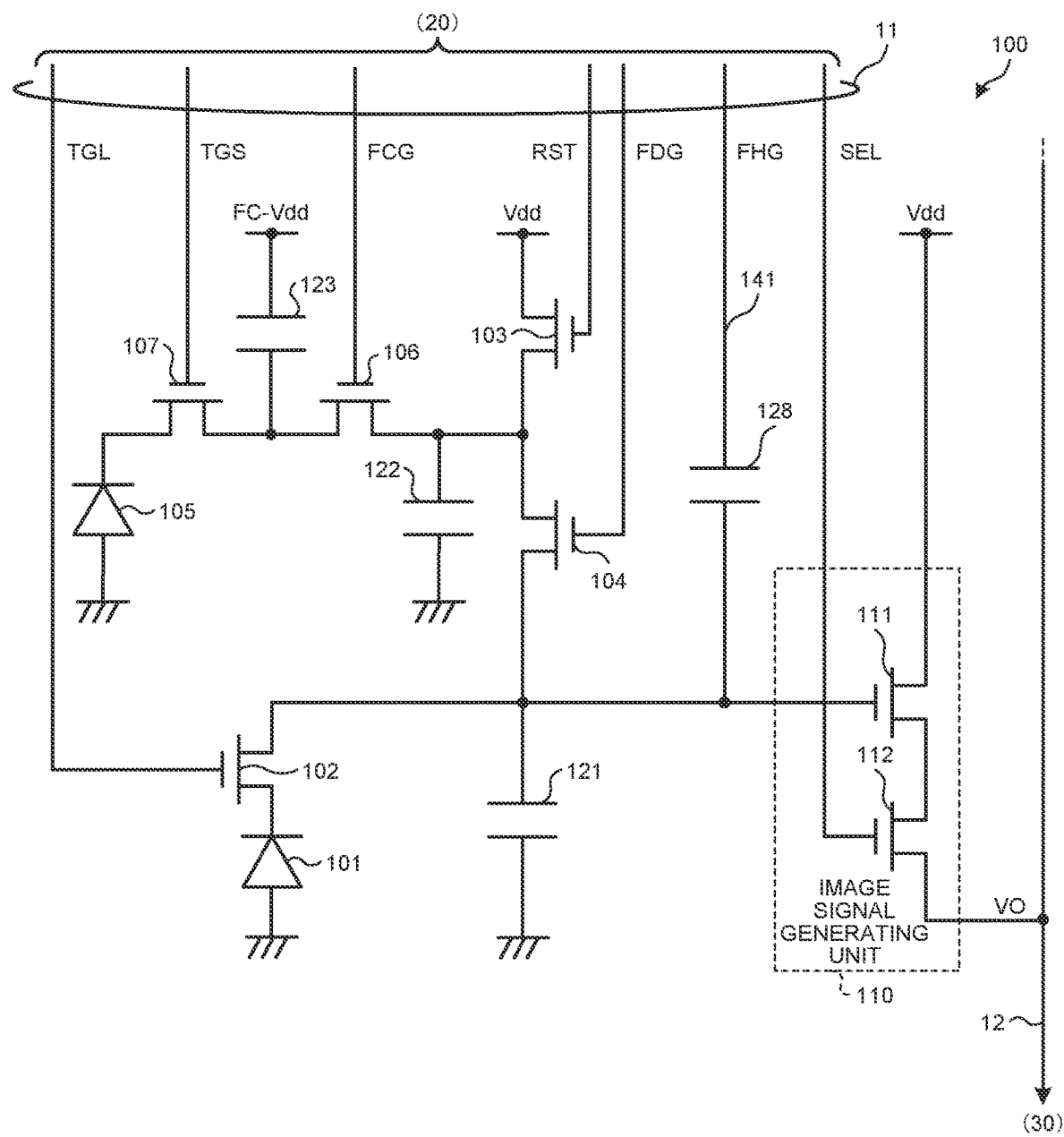
FIG. 14 is a diagram illustrating another configuration example of a pixel according to the third embodiment of the disclosure.

FIG. 14 is a diagram illustrating another configuration example of a pixel according to the third embodiment of the disclosure. The drawing is a circuit diagram illustrating a configuration example of a pixel 100 similarly to FIG. 12. The pixel 100 in the drawing is different from the pixel 100 in FIG. 12 in that capacitive coupling wiring 141 is coupled to a first charge retaining unit 121.

The capacitive coupling wiring 141 in the drawing is connected to wiring (node) connected to the first charge retaining unit 121 via a capacitor 128. Similarly to the pixel 100 in FIG. 12, the potential of the charge retaining unit can be adjusted.

The configuration of the imaging element 1 other than the above is similar to the configuration of the imaging element 1 in the second embodiment of the present disclosure, and thus description thereof is omitted.

As described above, the imaging element 1 according to the third embodiment of the present disclosure includes the third charge transfer unit 107 that transfers the charge generated by the second photoelectric conversion unit 105 and generates an image signal in the low-sensitivity mode. Also in this case, when an image signal in the high conversion efficiency mode is generated, the potential of the charge retaining unit can be adjusted by the capacitive coupling wiring 141.

4. Fourth Embodiment

In the imaging element 1 of the first embodiment described above, the potential of the charge retaining unit in the high conversion efficiency mode of the pixel 100 is adjusted. Meanwhile, an imaging element 1 according to a fourth embodiment of the present disclosure is different from the above-described first embodiment in that the potential of a charge retaining unit is adjusted even in the low conversion efficiency mode.

The circuits of FIGS. 2, 7, 8, 10, 11, and 13 can be applied to pixels 100 of the imaging element 1 according to the fourth embodiment of the present disclosure.

[Generation of Image Signal]

Figure 15A:
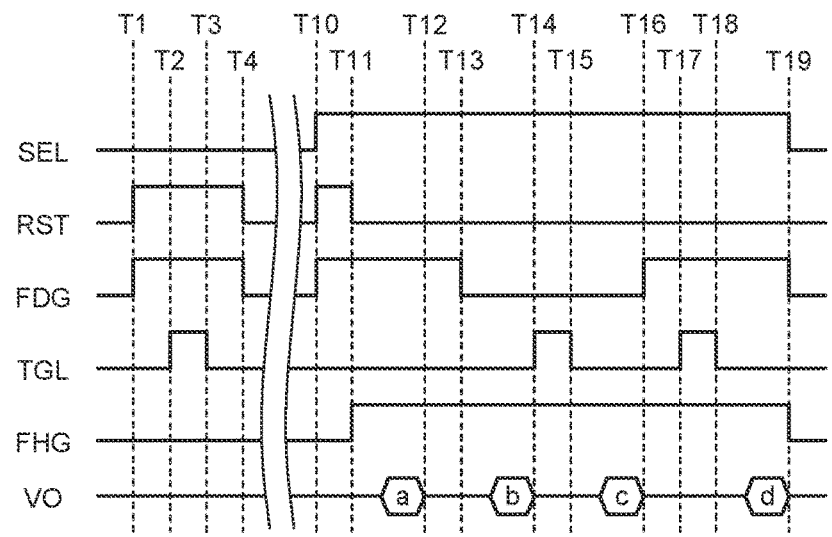
FIG. 15A is a diagram illustrating an example of generation of image signals according to a fourth embodiment of the disclosure.

FIG. 15A is a diagram illustrating an example of generation of image signals according to the fourth embodiment of the disclosure. The drawing is a timing chart illustrating an example of generation of image signals in a pixel 100 in a case where the circuit of FIG. 2 is adopted. Parts different from the generation procedure of FIG. 6 will be described.

Application of an adjustment signal to a signal line FHG is extended to a period from T11 to T19. As a result, it is possible to raise the potential during the period in which charges are retained in the first charge retaining unit 121 and the second charge retaining unit 122.

Figure 15B:
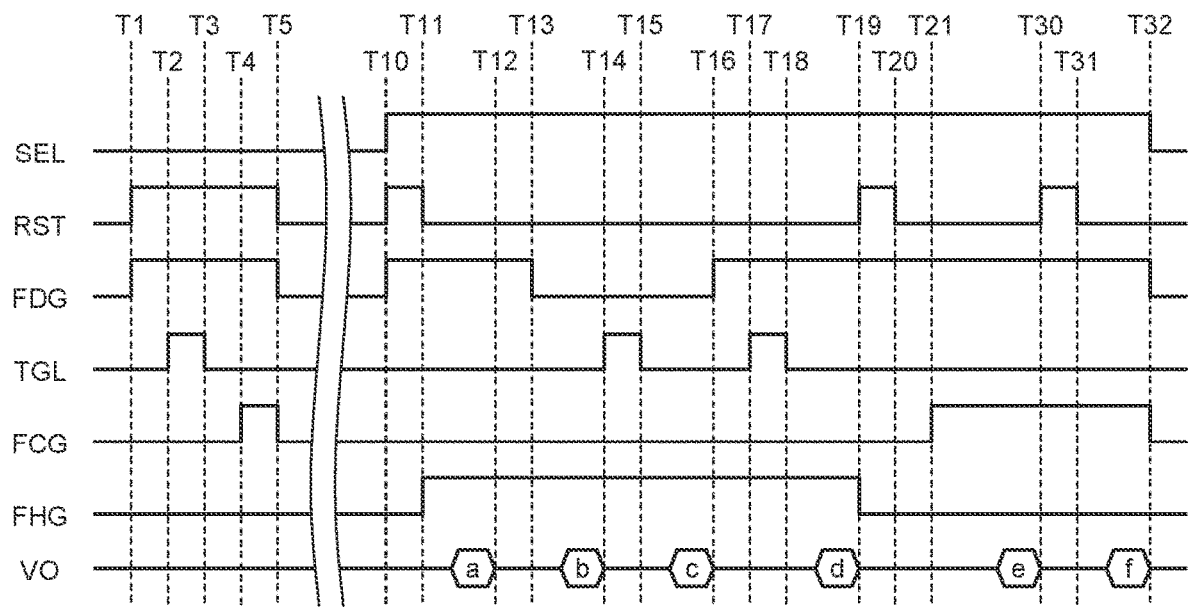
FIG. 15B is a diagram illustrating an example of generation of image signals according to the fourth embodiment of the disclosure.

FIG. 15B is a diagram illustrating an example of generation of image signals according to the fourth embodiment of the disclosure. The drawing is a timing chart illustrating an example of generation of image signals in the pixel 100 in a case where the circuit of FIGS. 9 and 10 is adopted. Parts different from the generation procedure of FIG. 10 will be described.

Application of an adjustment signal to a signal line FHG is extended to a period from T11 to T19. As a result, it is possible to raise the potential during the period in which charges are retained in the first charge retaining unit 121 and the second charge retaining unit 122. Note that, also in a case where the circuit of FIGS. 12 and 13 is adopted, the adjustment signal can be applied to the signal line FHG at the same timing as in FIG. 15B.

By raising the potentials of the first charge retaining unit 121 and the second charge retaining unit 122, the potentials of the first charge retaining unit 121 and the second charge retaining unit 122 can be deepened. As a result, the retention capacity of the charge retaining unit can be increased. Therefore, even in a case where the amount of incident light is large as in imaging in a bright environment, saturation of image signals can be prevented.

The configuration of the imaging element 1 other than the above is similar to the configuration of the imaging element 1 in the first embodiment of the present disclosure, and thus description thereof is omitted.

As described above, the imaging element 1 according to the fourth embodiment of the present disclosure applies the adjustment voltage of a relatively high voltage via the capacitive coupling wiring 141 during the period in which a charge is retained in the charge retaining unit. As a result, the charge retention capacity can be increased. Therefore, saturation of image signals can be prevented, and deterioration in the image quality can be prevented.

5. Fifth Embodiment

In the imaging element 1 of the fourth embodiment described above, the adjustment signal of the high voltage is applied to the charge retaining unit. Meanwhile, an imaging element 1 according to a fifth embodiment of the present disclosure is different from the above-described first embodiment in that an adjustment signal of a low voltage is applied to a charge retaining unit.

The circuits of FIGS. 2, 7, 8, 10, 11, and 13 can be applied to pixels 100 of the imaging element 1 according to the fifth embodiment of the present disclosure.

[Generation of Image Signal]

Figure 16A:
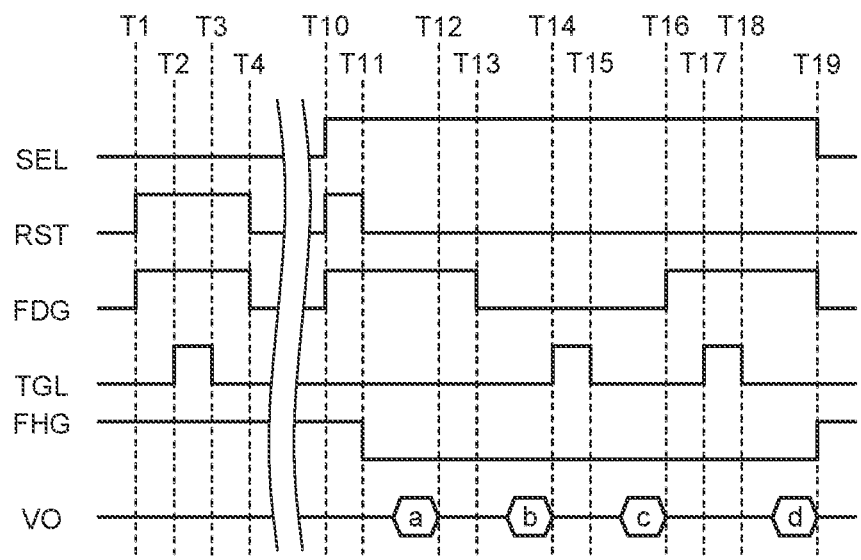
FIG. 16A is a diagram illustrating an example of generation of image signals according to a fifth embodiment of the disclosure.

FIG. 16A is a diagram illustrating an example of generation of image signals according to the fifth embodiment of the disclosure. The drawing is a timing chart illustrating an example of generation of image signals in a pixel 100 in a case where the circuit of FIG. 2 is adopted. Parts different from the generation procedure of FIG. 15A will be described.

During a period from T11 to T19, an adjustment signal having a voltage lower than that in the steady state is applied to a signal line FHG. As a result, it is possible to lower the potential during the period in which charges are retained in the first charge retaining unit 121 and the second charge retaining unit 122.

In a case where the potential of the charge retaining unit is high, there are cases where a strong electric field is formed between the charge retaining unit and a semiconductor region adjacent to the charge retaining unit. For example, in a case where a relatively low off-voltage is applied to a gate of the charge transfer unit 102 in order to enhance the non-conductive state, a strong electric field is generated between the gate of the charge transfer unit 102 and the first charge retaining unit 121. There are cases where this strong electric field causes a relatively large leakage current, thereby generating a so-called white spot in which an image signal is changed and deteriorating the image quality. Therefore, the potential of the charge retaining unit during the period in which the charge is retained is lowered by applying an adjustment signal of a low voltage. As a result, an electric field between the charge retaining unit and the semiconductor region adjacent to the charge retaining unit is weakened, thereby preventing occurrence of white spots.

Figure 16B:
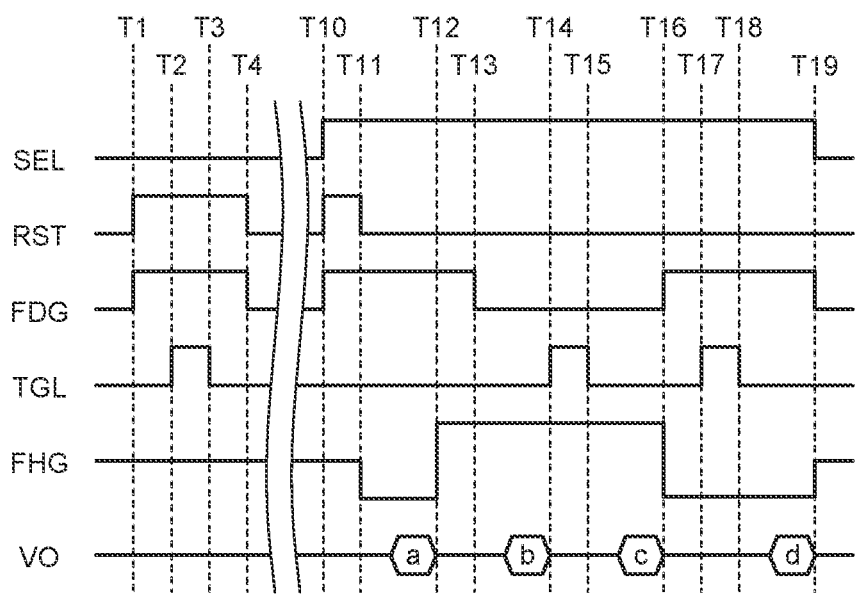
FIG. 16B is a diagram illustrating another example of generation of image signals according to the fifth embodiment of the disclosure.

FIG. 16B is a diagram illustrating another example of generation of image signals according to the fifth embodiment of the disclosure. During a period from T11 to T12 and a period from T16 to T19, an adjustment signal having a voltage lower than that in the steady state is applied to the signal line FHG. As in FIG. 16A, the potential during a period, in which charges are applied to the first charge retaining unit 121 and the second charge retaining unit 122, is lowered. Note that the adjustment signal of the capacitive coupling wiring 141 (FHG) in the drawing have three values of that in the steady state, of a high voltage, and of a low voltage.

Meanwhile, during the period from T12 to T16, an adjustment signal having a voltage higher than that in the steady state can be applied to the signal line FHG. The potential during the period in which the charge is retained in the first charge retaining unit 121 is increased.

As described above, in the example of FIG. 16B, it is possible to improve the charge transfer efficiency by compensating for an increase in the potential in the high conversion efficiency mode while preventing occurrence of white spots in the low conversion efficiency mode.

[Another Example of Image Signal Generation]

Figure 17A:
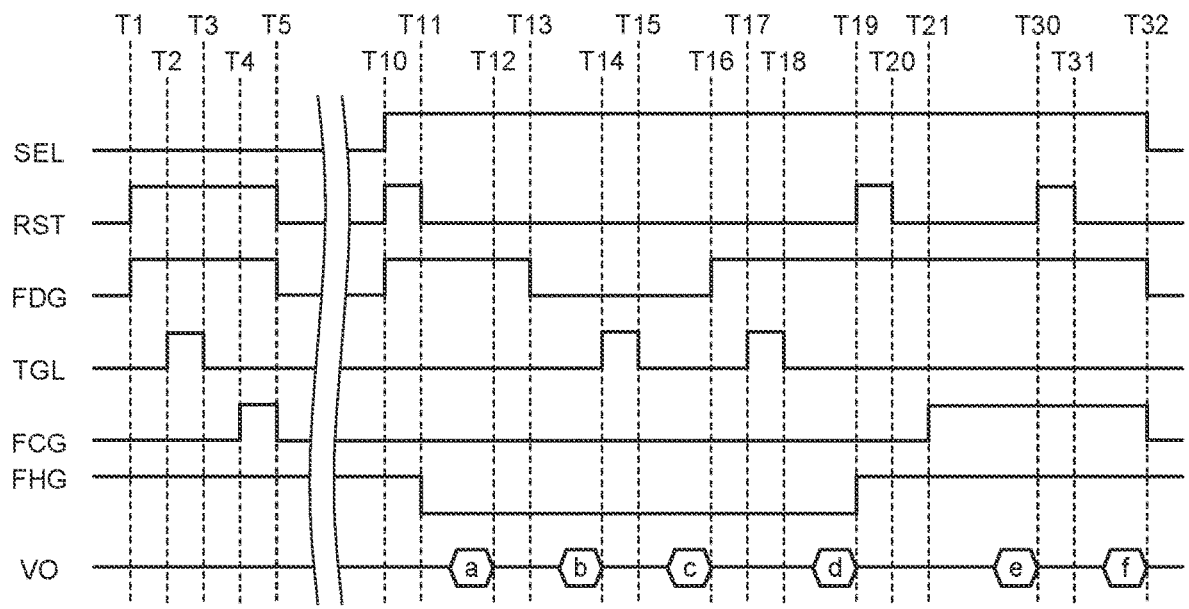
FIG. 17A is a diagram illustrating another example of generation of image signals according to the fifth embodiment of the disclosure.

FIG. 17A is a diagram illustrating another example of generation of image signals according to the fifth embodiment of the disclosure. The drawing is a timing chart illustrating an example of generation of image signals in the pixel 100 in a case where the circuit of FIGS. 9 and 10 is adopted. Parts different from the generation procedure of FIG. 15B will be described.

During a period from T11 to T19, an adjustment signal having a voltage lower than that in the steady state is applied to the signal line FHG. As in FIG. 16A, it is possible to lower the potential during a period in which charges are retained in the first charge retaining unit 121 and the second charge retaining unit 122, thereby making it possible to prevent occurrence of white spots.

Figure 17B:
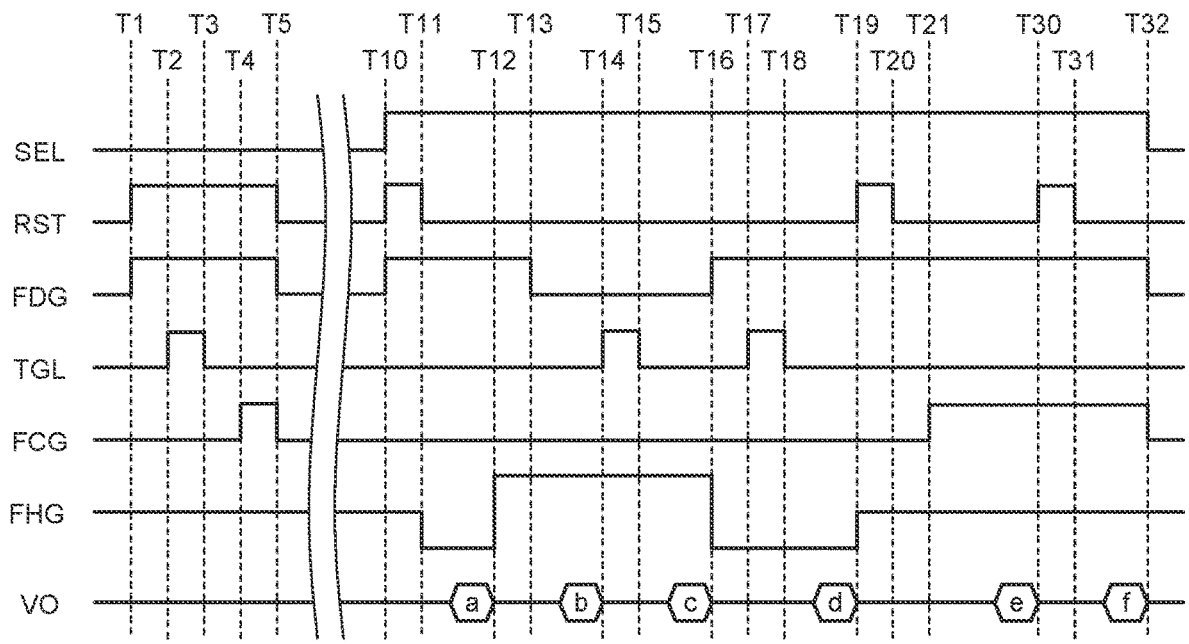
FIG. 17B is a diagram illustrating another example of generation of image signals according to the fifth embodiment of the disclosure.

FIG. 17B is a diagram illustrating another example of generation of image signals according to the fifth embodiment of the disclosure. During a period from T11 to T12 and a period from T16 to T19, an adjustment signal having a voltage lower than that in the steady state is applied to the signal line FHG. Meanwhile, during a period from T12 to T16, an adjustment signal having a voltage higher than that in the steady state is applied to the signal line FHG. It is possible to improve the charge transfer efficiency by compensating for a rise in the potential in the high conversion efficiency mode while preventing occurrence of white spots in the low conversion efficiency mode.

Note that the generation procedure of FIG. 17B can also be applied in a case where the circuit of FIGS. 12 and 13 is adopted.

The configuration of the imaging element 1 other than the above is similar to the configuration of the imaging element 1 in the fourth embodiment of the present disclosure, and thus description thereof is omitted.

As described above, the imaging element 1 according to the fifth embodiment of the present disclosure applies the adjustment voltage of a relatively low voltage via the capacitive coupling wiring 141 during the period in which a charge is retained in the charge retaining unit. As a result, it is possible to prevent occurrence of white spots and to prevent deterioration in the image quality.

6. Sixth Embodiment

In the imaging element 1 of the fourth embodiment described above, the potential of the charge retaining unit is adjusted in a period in which a charge is retained in the charge retaining unit. Meanwhile, an imaging element 1 according to a sixth embodiment of the present disclosure is different from the above-described fourth embodiment in that the potential of a charge retaining unit is adjusted even in an exposure period.

A pixel 100 of the imaging element 1 according to the sixth embodiment of the present disclosure retains, by a charge retaining unit, a charge having overflowed from a photoelectric conversion unit 101 during an exposure period. As described above in FIG. 3, a charge generated by photoelectric conversion by the photoelectric conversion unit 101 is retained in an n-type semiconductor region 131 included in the photoelectric conversion unit 101. However, when the amount of incident light increases and the retained charge amount exceeds a retention capacity of the n-type semiconductor region 131 during an exposure period, the charge overflows from the photoelectric conversion unit 101. When the overflowed charge flows into other pixels 100, an image signal having high luminance different from the original value is generated, and the image quality is deteriorated. This phenomenon is referred to as blooming. In order to prevent this phenomenon, an overflow path described above in FIG. 12 is formed in a charge transfer unit 102. The charge overflowed from the photoelectric conversion unit 101 is retained in a first charge retaining unit 121.

The circuits of FIGS. 2, 7, 8, 10, 11, and 13 can be applied to pixels 100 of the imaging element 1 according to the sixth embodiment of the present disclosure.

[Generation of Image Signal]

Figure 18A:
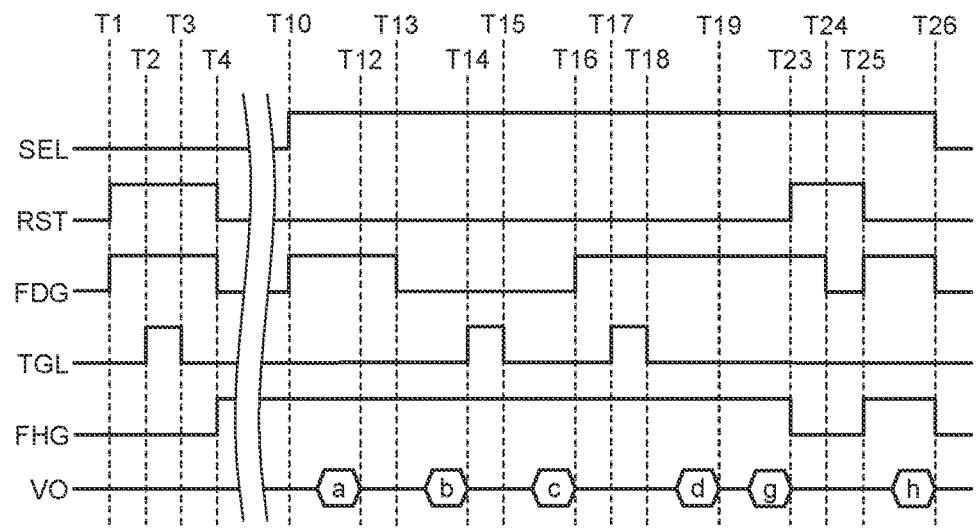
FIG. 18A is a diagram illustrating an example of generation of image signals according to a sixth embodiment of the disclosure.

FIG. 18A is a diagram illustrating an example of generation of image signals according to the sixth embodiment of the disclosure. The drawing is a timing chart illustrating an example of generation of image signals in the pixel 100 in a case where the circuit of FIGS. 2 and 6 is adopted.

At T4, an adjustment signal is applied to a signal line FHG. The application of the adjustment voltage to the signal line FHG continues until T23 in the drawing. As a result, an adjustment signal of a high voltage is applied to the charge retaining unit even during an exposure period. Note that the charge overflowed from the photoelectric conversion unit 101 during a period from T4 to T10 is retained in the first charge retaining unit 121.

Next, at T10, the ON voltage is applied to a signal line SEL. The application of the ON voltage to the signal line SEL continues until T26 in the drawing. In addition, the ON voltage is applied to a signal line FDG, and the coupling unit 104 is brought into a conductive state. As a result, the charge of the photoelectric conversion unit 101 is retained in the first charge retaining unit 121 and the second charge retaining unit 122. Then, a signal output to the signal line VO in a period up to T12 is retained in the column signal processing unit 30 as a reset signal "a".

Next, at T13, the application of the ON voltage to the signal line FDG is stopped. A signal output to the signal line VO in a period up to T14 is retained in the column signal processing unit 30 as a reset signal "b".

Next, at T14, the ON voltage is applied to a signal line TGL. The charge generated and retained in the photoelectric conversion unit 101 during the exposure period is transferred to the first charge retaining unit 121.

Next, at T15, the application of the ON voltage to the signal line TGL is stopped. Then, a signal output to the signal line VO in a period up to T16 is retained in the column signal processing unit 30 as an image signal C.

Next, at T16, an ON voltage is applied to the signal line FDG. The first charge retaining unit 121 and the second charge retaining unit 122 are coupled. The application of the ON voltage to the signal line FDG continues until T24.

Next, at T17, the ON voltage is applied to the signal line TGL. The charge generated and retained in the photoelectric conversion unit 101 in the period from T15 to T17 is transferred to the first charge retaining unit 121 and the second charge retaining unit 122.

Next, at T18, the application of the ON voltage to the signal line TGL is stopped. Then, a signal output to the signal line VO in a period up to T19 is retained in the column signal processing unit 30 as an image signal "d". Furthermore, immediately before T23, a signal output to the signal line VO is retained in the column signal processing unit 30 as an image signal "g".

Next, at T23, the application of the adjustment signal to the signal line FHG is stopped. Next, the ON voltage is applied to a signal line RST, and the first charge retaining unit 121 and the second charge retaining unit 122 are reset. The application of the ON voltage to the signal line RST is continued until T25.

Next, at T24, the application of the ON voltage to the signal line FDG is stopped. The first charge retaining unit 121 and the second charge retaining unit 122 are decoupled.

Next, at T25, the application of the ON voltage to the signal line RST is stopped. Next, an adjustment signal is applied to the signal line FHG. Then, a signal output to the signal line VO in a period up to T26 is retained in the column signal processing unit 30 as an image signal "h".

Next, at T26, the application of the ON voltage to the signal line FDG is stopped, and application of the adjustment signal to the signal line FHG is stopped.

As described above, also in the generation procedure of FIG. 18A, an image signal in the low conversion efficiency mode is generated from the reset signal "a" and the image signal "d", and an image signal in the high conversion efficiency mode is generated from the reset signal "b" and the image signal "c". These image signals do not include the charge overflowed from the photoelectric conversion unit 101 during the exposure period. This is because the influence of the charge having overflowed from the photoelectric conversion unit 101 and retained in the first charge retaining unit 121 during the exposure period is excluded by the CDS.

A reset signal "h" is acquired after the first charge retaining unit 121 and the second charge retaining unit 122 are reset in a period from T23 to T25. By performing the CDS using the reset signal "h" and the image signal "g", it is possible to generate an image signal in consideration of the charge overflowed from the photoelectric conversion unit 101 during the exposure period.

Furthermore, the charge retention capacity can be increased by applying an adjustment signal having a voltage higher than that in the steady state to the charge retaining unit via the signal line FHG in a period from T4 to T23.

[Another Example of Image Signal Generation]

Figure 18B:
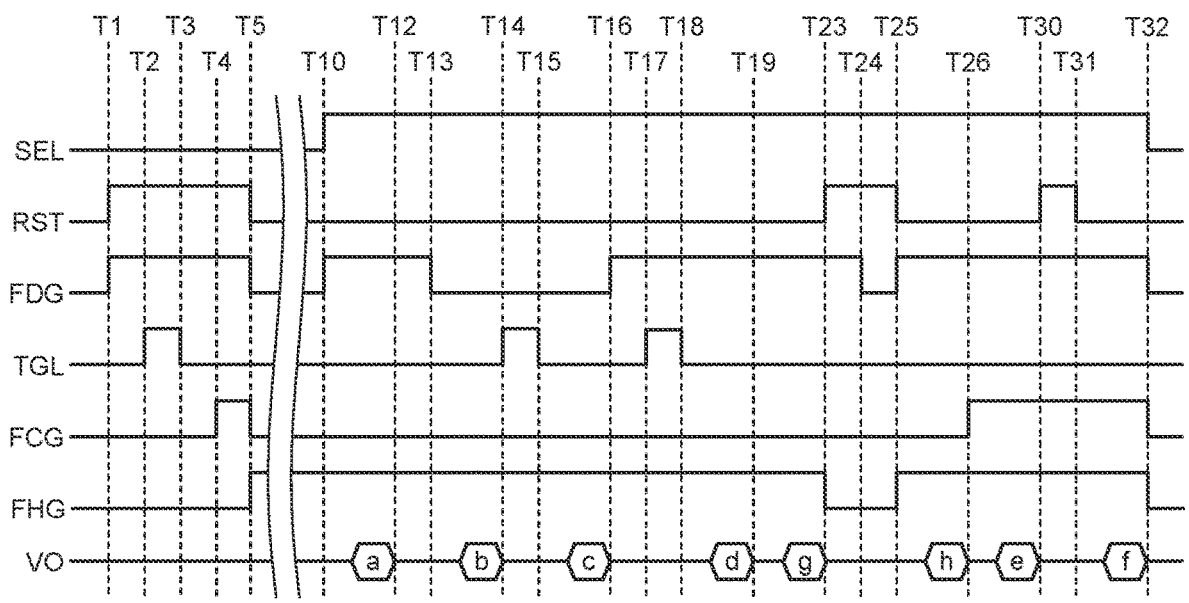
FIG. 18B is a diagram illustrating another example of generation of image signals according to the sixth embodiment of the disclosure.

FIG. 18B is a diagram illustrating another example of generation of image signals according to the sixth embodiment of the disclosure. The drawing is a timing chart illustrating an example of generation of image signals in the pixel 100 in a case where the circuit of FIGS. 9 and 10 is adopted. Parts different from the generation procedure of FIG. 18A will be described.

During a period from T4 to T5, the ON voltage is applied to a signal line FCG. The third charge retaining unit 123 is reset.

At T26, the ON voltage is applied to the signal line FCG, and the second charge transfer unit 106 is made conductive. The charges retained in the second photoelectric conversion unit 105 and the third charge retaining unit 123 are transferred to the first charge retaining unit 121 and the second charge retaining unit 122. The application of the ON voltage to the signal line FCG is continued until T32. In addition, application of the ON voltage to the signal line SEL and the signal line FDG and application of the adjustment potential to the signal line FHG are continued until T32. Then, a signal output to the signal line VO in a period up to T30 is retained in a column signal processing unit 30 as an image signal "e".

Next, during a period from T30 to T31, the ON voltage is applied to the signal line RST. Since the coupling unit 104 and the second charge transfer unit 106 are in the conductive state, the first charge retaining unit 121, the second charge retaining unit 122, and the third charge retaining unit 123 are reset.

Next, a signal output to the signal line VO in a period up to T32 is held in the column signal processing unit 30 as a reset signal "f".

An image signal in the low-sensitivity mode can be generated by the reset signal "f" and the image signal "e".

As described above, also in the pixel 100 including the second photoelectric conversion unit 105, image signals can be generated as in FIG. 18A.

Note that the generation procedure of FIG. 18B can also be applied in a case where the circuit of FIGS. 12 and 13 is adopted.

Furthermore, the charge retention capacity can be increased by applying an adjustment signal having a voltage higher than that in the steady state to the charge retaining unit via the signal line FHG in periods from T5 to T23 and from T26 to T32.

The configuration of the imaging element 1 other than the above is similar to the configuration of the imaging element 1 in the fourth embodiment of the present disclosure, and thus description thereof is omitted.

As described above, in the imaging element 1 according to the sixth embodiment of the present disclosure, in a case where an image signal is generated by causing the first charge retaining unit 121 to retain a charge overflowed from the photoelectric conversion unit 101, it is possible to apply an adjustment signal having a high voltage to the charge retaining unit and to increase the charge retention capacity. The dynamic range can be widened.

7. Seventh Embodiment

In the imaging element 1 of the second embodiment described above, the potential of the first charge retaining unit 121 or the second charge retaining unit 122 is adjusted. On the other hand, an imaging element 1 according to a seventh embodiment of the present disclosure is different from the above-described second embodiment in that a potential of a third charge retaining unit 123 is adjusted.

[Configuration of Imaging Element]

Figure 19:
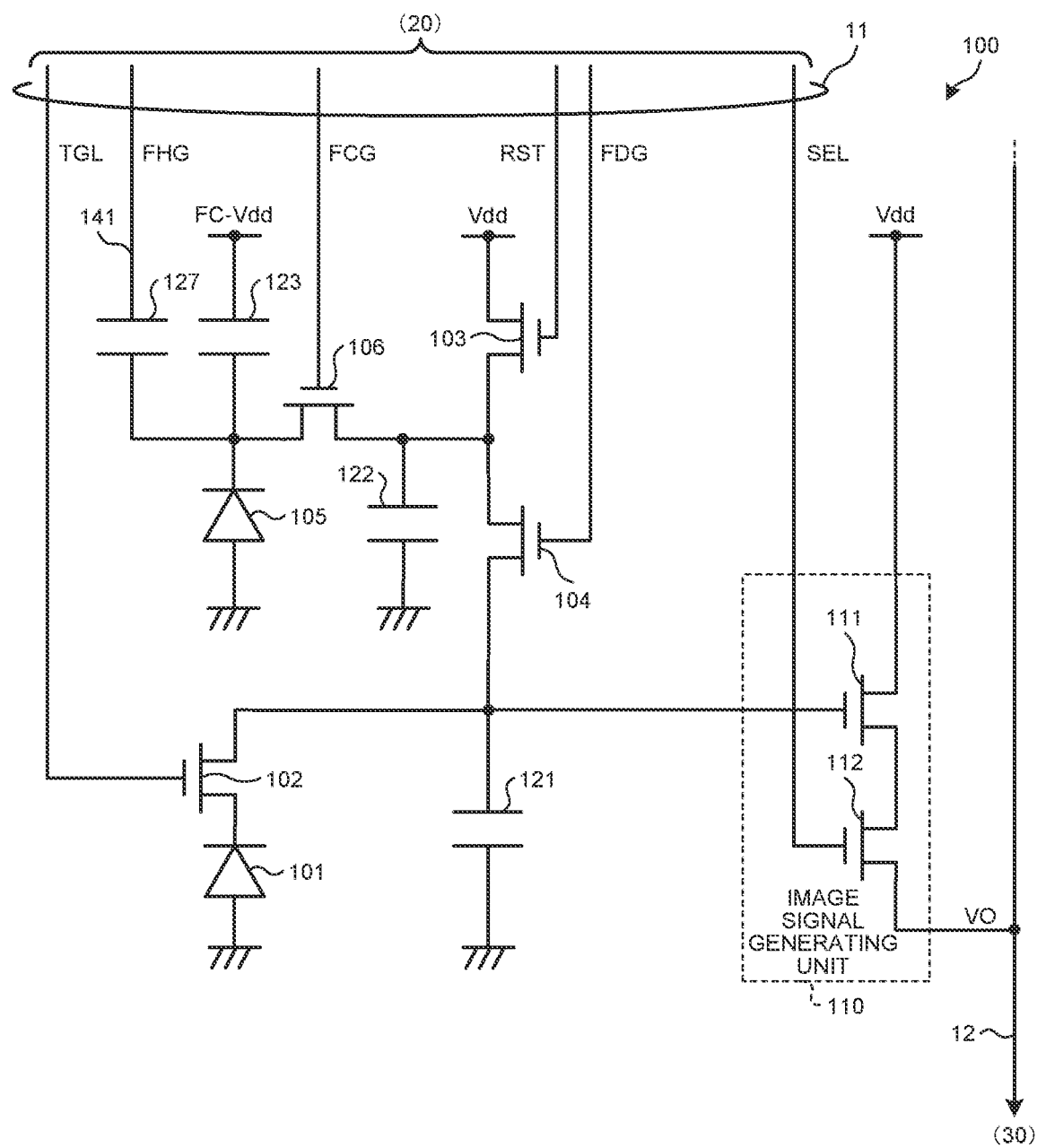
FIG. 19 is a diagram illustrating a configuration example of a pixel according to a seventh embodiment of the disclosure.

FIG. 19 is a diagram illustrating a configuration example of a pixel according to the seventh embodiment of the disclosure. The drawing is a circuit diagram illustrating a configuration example of a pixel 100 similarly to FIG. 9. A pixel 100 in the drawing is different from the pixel 100 in FIG. 9 in including a capacitor 127 instead of the capacitor 128.

Capacitive coupling wiring 141 is connected to a first end of the capacitor 127. A second end of the capacitor 127 is connected to a cathode of a second photoelectric conversion unit 105, a source of a second charge transfer unit 106, and a first end of the third charge retaining unit 123. Since other circuit connections are similar to those of the pixel 100 in FIG. 9, description thereof will be omitted.

The capacitor 127 corresponds to a stray capacitance between the capacitive coupling wiring 141 and the semiconductor region included in the third charge retaining unit 123.

[Generation of Image Signal]

Figure 20:
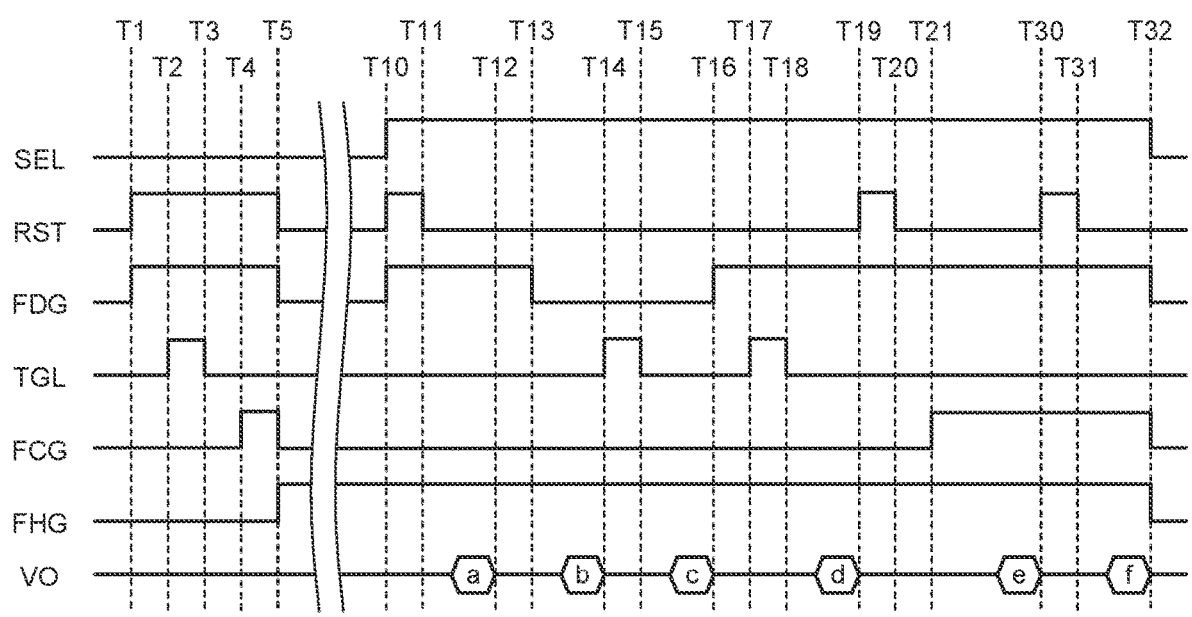
FIG. 20 is a diagram illustrating an example of generation of image signals according to the seventh embodiment of the disclosure.

FIG. 20 is a diagram illustrating an example of generation of image signals according to the seventh embodiment of the disclosure. The drawing is a timing chart illustrating an example of generation of image signals in the pixel 100, similarly to FIG. 10. In the generation procedure of image signals in the drawing, the timing of the adjustment signal of the capacitive coupling wiring 141 (FHG) is different from the timing of FIG. 10.

In the drawing, an adjustment signal of a voltage higher than that in the steady state is applied to the capacitive coupling wiring 141 (FHG) in a period from T5 to T32. The potential of the third charge retaining unit 123 is high in a period in which the charge generated by the photoelectric conversion by the second photoelectric conversion unit 105 is retained in the third charge retaining unit 123. As a result, the charge retention capacity of the third charge retaining unit 123 can be increased.

Note that the generation procedure of FIG. 20 can also be applied to the circuit of FIGS. 12 and 13. In this case, due to an overflow path formed in the third charge transfer unit 107, charges are accumulated in the third charge retaining unit 123 even during an exposure period. Therefore, by applying an adjustment signal of a high voltage via the capacitive coupling wiring 141 during the exposure period, the retention capacity can be increased.

The configuration of the imaging element 1 other than the above is similar to the configuration of the imaging element 1 in the second embodiment of the present disclosure, and thus description thereof is omitted.

As described above, in the imaging element 1 according to the seventh embodiment of the present disclosure, the charge retention capacity can be increased by applying the adjustment signal of a high voltage to the third charge retaining unit 123. The dynamic range in the low-sensitivity mode can be widened.

8. Eighth Embodiment

In the imaging element 1 of the sixth embodiment described above, the potential of the charge retaining unit is adjusted to a high potential in the exposure period and the period in which the charge retaining unit retains a charge. On the other hand, an imaging element 1 of an eighth embodiment of the present disclosure is different from the above-described sixth embodiment in that the potential of a charge retaining unit in an exposure period and a period in which a charge is retained in the charge retaining unit is adjusted to a low potential.

A pixel 100 of the imaging element 1 according to the eighth embodiment of the present disclosure retains, by the charge retaining unit, a charge having overflowed from a photoelectric conversion unit 101 during an exposure period similarly to the imaging element 1 according to the sixth embodiment. There are cases where a charge, other than charges based on photoelectric conversion of incident light, flows into the charge retaining unit. For example, there are cases where a current is generated due to movement of a charge between one of a crystal defect in the vicinity of a semiconductor region included in the charge retaining unit or an interface state on a surface of a semiconductor substrate 130 and the charge retaining unit. Such a current based on the movement of a charge not attributable to photoelectric conversion is referred to as a dark current. This dark current causes noise in an image signal. The dark current can be reduced by lowering the potential of the charge retaining unit. Specifically, the dark current can be reduced by applying an adjustment signal of a low voltage to the charge retaining unit via the capacitive coupling wiring 141.

The circuits of FIGS. 2, 7, 8, 10, 11, and 13 can be applied to pixels 100 of the imaging element 1 according to the eighth embodiment of the present disclosure.

[Generation of Image Signal]

Figure 21A:
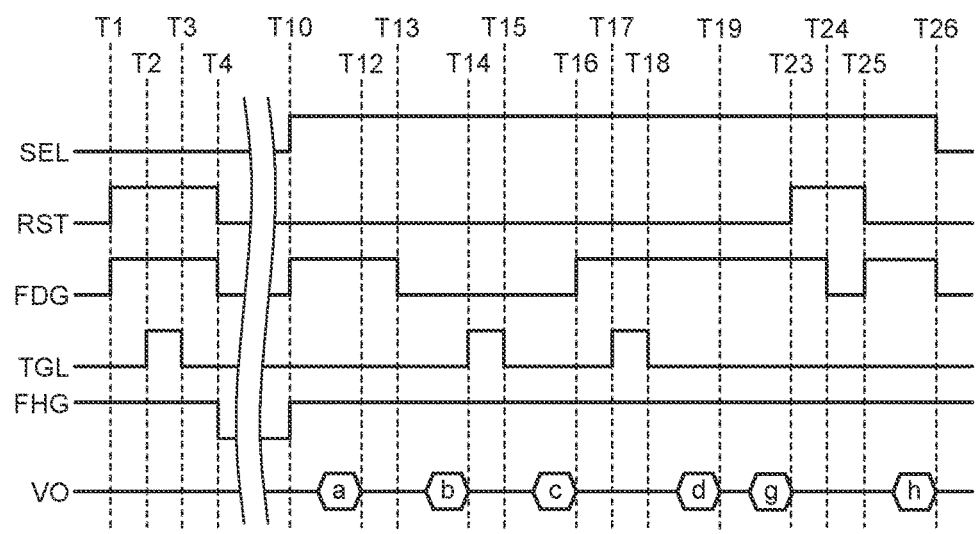
FIG. 21A is a diagram illustrating an example of generation of image signals according to an eighth embodiment of the disclosure.

FIG. 21A is a diagram illustrating an example of generation of image signals according to the eighth embodiment of the disclosure. Similarly to FIG. 18A, the drawing is a timing chart illustrating an example of generation of image signals in the pixel 100 in a case where the circuit of FIG. 2 is adopted. Parts different from the generation procedure of FIG. 18A will be described.

During a period from T4 to T10, an adjustment signal having a voltage lower than that in the steady state is applied to the capacitive coupling wiring 141. As a result, the potentials of a first charge retaining unit 121 and a second charge retaining unit 122 are lowered, and the dark current is reduced. Note that, in a period from T23 to T25, no adjustment signal of a low voltage is applied.

[Another Example of Image Signal Generation]

Figure 21B:
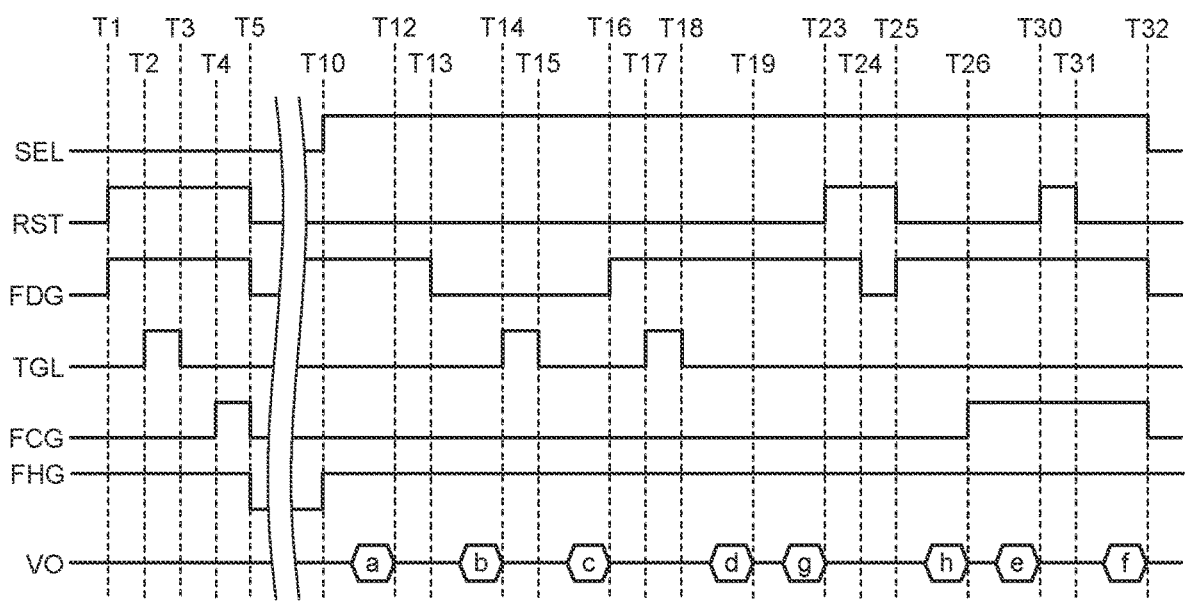
FIG. 21B is a diagram illustrating another example of generation of image signals according to the eighth embodiment of the disclosure.

FIG. 21B is a diagram illustrating another example of generation of image signals according to the eighth embodiment of the disclosure. Similarly to FIG. 18B, the drawing is a timing chart illustrating an example of generation of image signals in the pixel 100 in a case where the circuit of FIGS. 9 and 10 is adopted. Parts different from the generation procedure of FIG. 18B will be described.

During a period from T5 to T10, an adjustment signal having a voltage lower than that in the steady state is applied to the capacitive coupling wiring 141. As a result, the potentials of the first charge retaining unit 121 and the second charge retaining unit 122 are lowered. Similarly to the procedure of FIG. 21A, the dark current can be reduced. Note that, similarly to FIG. 21A, no adjustment signal of a low voltage is applied in a period from T23 to T25.

The configuration of the imaging element 1 other than the above is similar to the configuration of the imaging element 1 in the sixth embodiment of the present disclosure, and thus description thereof is omitted.

As described above, in the imaging element 1 according to the eighth embodiment of the present disclosure, in a case where an image signal is generated by causing the first charge retaining unit 121 to retain a charge overflowed from the photoelectric conversion unit 101, it is possible to reduce a dark current by applying an adjustment signal of a low voltage to the charge retaining unit. It is possible to prevent deterioration in image quality.

9. Ninth Embodiment

In the imaging element 1 of the seventh embodiment described above, the potential of the third charge retaining unit 123 is adjusted. Meanwhile, an imaging element 1 according to a ninth embodiment of the present disclosure is different from the above-described seventh embodiment in that a blooming countermeasure is further performed.

In the generation procedure of image signals described above with reference to FIG. 20, the charges overflowed from the photoelectric conversion unit 101 during the exposure period are retained in the first charge retaining unit 121 and the second charge retaining unit 122. When the retained charge exceeds the retention capacities of the first charge retaining unit 121 and the second charge retaining unit 122, the charge overflows from the first charge retaining unit 121 and the second charge retaining unit 122. This overflowed charge causes blooming. In addition, when the overflowed charges flow into the third charge retaining unit 123 over the potential immediately below a gate of the second charge transfer unit 106, an error occurs in an image signal in the low-sensitivity mode. Therefore, the overflowed charge is discharged by a reset unit 103. Specifically, the potential immediately below the gate of the reset unit 103 while being non-conductive is made relatively deep. As a result, even when the reset unit 103 is in a non-conductive state, the charges overflowed from the first charge retaining unit 121 and the second charge retaining unit 122 can be discharged.

However, if the potential immediately below the gate of the reset unit 103 while being non-conductive is made deep, when the charge of the second photoelectric conversion unit 105 retained in the third charge retaining unit 123 is transferred to the charge retaining unit, a part of the charge is discharged by the reset unit 103. This causes an error in the image signal in the low-sensitivity mode. Therefore, the potential of the third charge retaining unit 123 is increased to increase the charge retention capacity of the third charge retaining unit 123. This makes it possible to prevent the reset unit 103 from discharging the charge retained in the third charge retaining unit 123. This process will be described with reference to FIGS. 22A and 22B.

[Transfer of Charge]

Figure 22A:
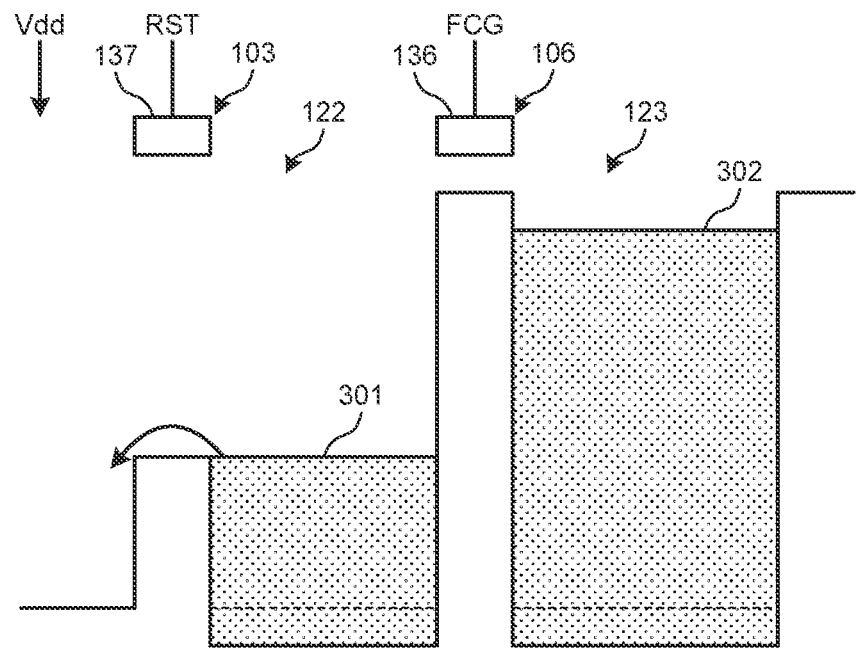
FIG. 22A is a diagram illustrating an example of the potential of a pixel according to a ninth embodiment of the disclosure.

FIG. 22A is a diagram illustrating an example of the potential of a pixel according to the ninth embodiment of the disclosure. The drawing illustrates potentials of the reset unit 103, the second charge retaining unit 122, the second charge transfer unit 106, and the third charge retaining unit 123 during an exposure period. In the drawing, white rectangles represent the gate 137 of the reset unit 103 and a gate 136 of the second charge transfer unit 106. The gate 137 and the gate 136 are connected to a signal line RST and a signal line FCG, respectively. In addition, hatched rectangles in the drawing represent charges 301 and 302 retained in the second charge retaining unit 122 and the second photoelectric conversion unit 105, respectively. Note that the potential of the second photoelectric conversion unit 105 is substantially equal to the potential of the third charge retaining unit 123.

Since it is in an exposure period, both the reset unit 103 and the second charge transfer unit 106 are in a non-conductive state. As described above, the potential immediately below the gate 137 of the reset unit 103 is deeper than that of the second charge transfer unit 106. Therefore, the charges overflowed from the first charge retaining unit 121 and the second charge retaining unit 122 during the exposure period pass over the potential of the reset unit 103 and are discharged to the power supply line Vdd. An arrow in the drawing represents the discharge of these charges. Since an adjustment signal is applied, the potentials of the second charge retaining unit 122 and the third charge retaining unit 123 become deep. A broken line in the drawing represents a potential of a case where the adjustment signal is not applied. After an image signal based on a charge 301 is generated, the charge 301 is discharged by the reset operation of the reset unit 103.

Figure 22B:
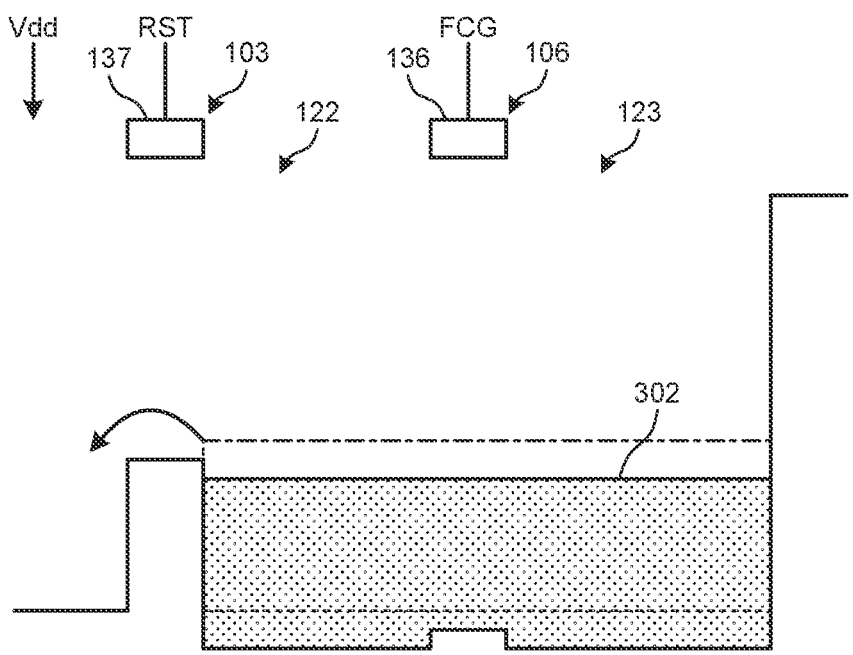
FIG. 22B is a diagram illustrating an example of the potential of a pixel according to the ninth embodiment of the disclosure.

FIG. 22B is a diagram illustrating an example of the potential of a pixel according to the ninth embodiment of the disclosure. The drawing illustrates a potential when a charge 302 generated by the second photoelectric conversion unit 105 is transferred to the second charge retaining unit 122. The second charge transfer unit 106 is brought into the conductive state, and the charge 302 generated and retained by the second photoelectric conversion unit 105 is transferred (distributed) to the second charge retaining unit 122.

On the other hand, an alternate long and short dash line in the drawing represents the charge of the second charge retaining unit 122 when no adjustment signal is applied. A part of this charge overflows from the potential immediately below the gate 137 of the reset unit 103 in the non-conductive state, and an error occurs in an image signal in the low-sensitivity mode.

The configuration of the imaging element 1 other than the above is similar to the configuration of the imaging element 1 in the seventh embodiment of the present disclosure, and thus description thereof is omitted.

As described above, in the imaging element 1 according to the ninth embodiment of the present disclosure, it is possible to increase the charge retention capacity in a case where the adjustment signal of the high voltage is applied to the third charge retaining unit 123 and the potential of the reset unit 103 is deepened to take a countermeasure against blooming. The errors in an image signal in the low-sensitivity mode can be reduced.

10. Configuration of Imaging Device

The technology according to the present disclosure can be applied to various products. For example, the technology according to the present disclosure can be applied to imaging devices such as cameras.

Figure 23:
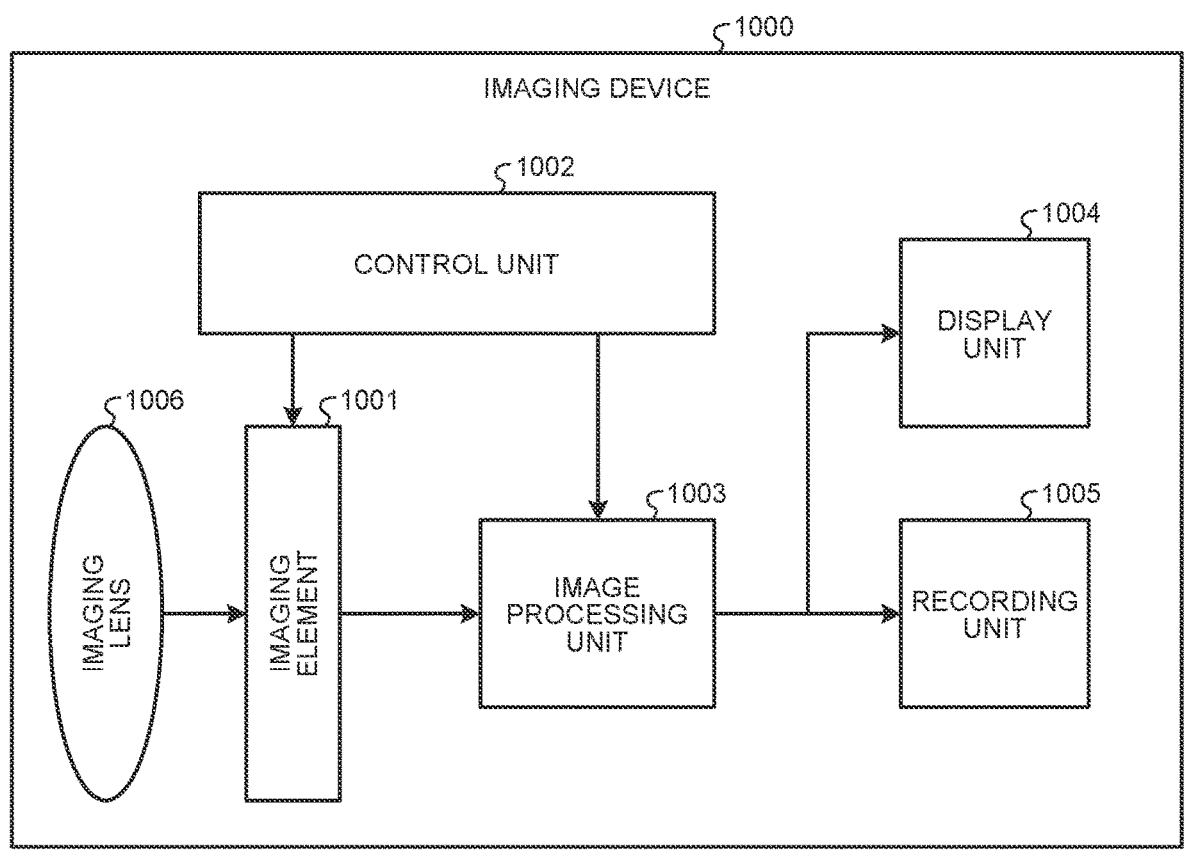
FIG. 23 is a diagram illustrating an exemplary configuration of an imaging device to which the technology according to the disclosure can be applied.

FIG. 23 is a diagram illustrating an exemplary configuration of an imaging device to which the technology according to the disclosure can be applied. An imaging device 1000 in the drawing includes an imaging element 1001, a control unit 1002, an image processing unit 1003, a display unit 1004, a recording unit 1005, and an imaging lens 1006.

The imaging lens 1006 is a lens that collects light from a subject. The subject is imaged on a light receiving plane of the imaging element 1001 by the imaging lens 1006.

The imaging element 1001 captures an image of a subject. A plurality of pixels including a photoelectric conversion unit that performs photoelectric conversion of light from a subject is arranged on the light receiving plane of the imaging element 1001. Each of the plurality of pixels generates an image signal based on a charge generated by photoelectric conversion. The imaging element 1001 converts image signals generated by the pixels into digital image signals and outputs the digital image signals to the image processing unit 1003. Note that image signals for one screen are referred to as a frame. The imaging element 1001 can also output image signals frame by frame.

The control unit 1002 controls the imaging element 1001 and the image processing unit 1003. The control unit 1002 can include, for example, an electronic circuit using a microcomputer or the like.

The image processing unit 1003 processes an image signal from the imaging element 1001. The processing of an image signal in the image processing unit 1003 corresponds to, for example, demosaic processing of generating an image signal of a color that is insufficient when a color image is generated or noise reduction processing of removing noise of the image signal. The image processing unit 1003 can include, for example, an electronic circuit using a microcomputer or the like.

The display unit 1004 displays an image on the basis of the image signals processed by the image processing unit 1003. The display unit 1004 can include, for example, a liquid crystal monitor.

The recording unit 1005 records an image (frame) based on the image signals processed by the image processing unit 1003. The recording unit 1005 can include, for example, a hard disk or a semiconductor memory.

The imaging device to which the present disclosure can be applied has been described above. The present technology can be applied to the imaging element 1001 among the above-described components. Specifically, the imaging element 1 described in FIG. 1 can be applied to the imaging element 1001. Note that the image processing unit 1003 is an example of the processing circuit described in the claims. The imaging device 1000 is an example of the imaging device described in the claims.

Effects

An imaging element 1 according to the present disclosure includes a photoelectric conversion unit 101, a charge retaining unit (a first charge retaining unit 121 and a second charge retaining unit 122), a charge transfer unit 102, a reset unit 103, an image signal generating unit 110, capacitive coupling wiring 141, and a vertical drive unit 20. The photoelectric conversion unit 101 is formed on a semiconductor substrate and performs photoelectric conversion of incident light. The charge retaining unit (the first charge retaining unit 121 and the second charge retaining unit 122) retains a charge generated by the photoelectric conversion. The charge transfer unit 102 transfers the charge generated by the photoelectric conversion to the charge retaining unit. The reset unit 103 discharges the charge retained in the charge retaining unit. The image signal generating unit 110 generates an image signal on the basis of the charge retained in the charge retaining unit. The capacitive coupling wiring 141 is different from wiring that transmits control signals of the charge transfer unit, the reset unit, and the image signal generating unit and wiring that transmits the generated image signal and is capacitively coupled to the charge retaining unit. The vertical drive unit 20 applies an adjustment signal for adjusting the potential of the charge retaining unit via the capacitive coupling wiring. As a result, the potential of the charge retaining unit can be adjusted.

In addition, a wiring region 140 may be further included in which wiring that is arranged adjacent to the semiconductor substrate and transmits control signals of the charge transfer unit 102, the reset unit 103, and the image signal generating unit 110, wiring that transmits the generated image signal, and the capacitive coupling wiring 141 are arranged.

In addition, the wiring region 140 may include a plurality of pieces of laminated wiring, and the capacitive coupling wiring 141 may include the plurality of pieces of wiring. The capacitive coupling wiring 141 can include multilayer wiring.

In addition, the capacitive coupling wiring 141 may include wiring arranged in a layer closest to the semiconductor substrate among the plurality of pieces of wiring. As a result, the coupling capacity of the capacitive coupling wiring 141 can be improved.

In addition, the capacitive coupling wiring 141 may be disposed in parallel with at least one of the pieces of wiring for transmitting control signals of the charge transfer unit 102, the reset unit, and the image signal generating unit in the wiring region 140.

In addition, the charge retaining unit (the first charge retaining unit 121 and the second charge retaining unit 122) may include the first charge retaining unit 121, the second charge retaining unit 122, and the coupling unit 104 that couples the first charge retaining unit 121 and the second charge retaining unit 122, the charge transfer unit 102 may transfer the charge generated by the photoelectric conversion to the first charge retaining unit 121, the reset unit may discharge the charge retained in the second charge retaining unit 122, the image signal generating unit 110 may generate the image signal on the basis of the charge retained in the first charge retaining unit 121, and the capacitive coupling wiring 141 may be different from the wiring that transmits control signals of the charge transfer unit (the first charge retaining unit 121 and the second charge retaining unit 122), the reset unit 103, the image signal generating unit 110, and the coupling unit 104 and the wiring that transmits the generated image signal. As a result, the capacity of the charge retaining unit can be switched.

Furthermore, the capacitive coupling wiring 141 may be capacitively coupled to either the first charge retaining unit 121 or the second charge retaining unit 122.

Furthermore, the second photoelectric conversion unit 105 that is formed on the semiconductor substrate and performs photoelectric conversion of incident light, the third charge retaining unit 123 that retains the charge generated by photoelectric conversion by the second photoelectric conversion unit 105, and the second charge transfer unit 106 that transfers the charge retained in the third charge retaining unit 123 to the second charge retaining unit 122 may be further included, and the capacitive coupling wiring 141 may be different from the wiring that transmits control signals of the charge transfer unit (the first charge retaining unit 121 and the second charge retaining unit 122), the reset unit 103, the image signal generating unit 110, the coupling unit 104, and the second charge transfer unit 106 and the wiring that transmits the generated image signal. As a result, image signals can be generated by combining a plurality of photoelectric conversion units.

Furthermore, the capacitive coupling wiring 141 may be capacitively coupled to any of the first charge retaining unit 121, the second charge retaining unit 122, and the third charge retaining unit 123. As a result, the potentials of the first charge retaining unit 121, the second charge retaining unit 122, and the third charge retaining unit 123 can be adjusted.

Furthermore, the third charge transfer unit 107 that transfers the charge generated by the second photoelectric conversion unit 105 to the third charge retaining unit 123 may be further included, and the capacitive coupling wiring 141 may be different from the wiring that transmits control signals of the charge transfer unit (the first charge retaining unit 121 and the second charge retaining unit 122), the reset unit 103, the image signal generating unit 110, the coupling unit 104, the second charge transfer unit 106, and the third charge transfer unit 107 and the wiring that transmits the generated image signal.

Furthermore, the vertical drive unit 20 may apply the adjustment signal for adjusting the charge retaining unit (the first charge retaining unit 121 and the second charge retaining unit 122) to a high potential in a period in which the charge retaining unit (the first charge retaining unit 121 and the second charge retaining unit 122) retains the charge. As a result, the potential of the charge retaining unit (the first charge retaining unit 121 and the second charge retaining unit 122) can be deepened.

Furthermore, the vertical drive unit 20 may apply the adjustment signal for adjusting the charge retaining unit (the first charge retaining unit 121 and the second charge retaining unit 122) to a low potential in a period in which the charge retaining unit (the first charge retaining unit 121 and the second charge retaining unit 122) retains the charge. As a result, the potential of the charge retaining unit (the first charge retaining unit 121 and the second charge retaining unit 122) can be lowered.

Furthermore, the vertical drive unit 20 may apply the adjustment signal when the charge having overflowed from the photoelectric conversion unit 101 in the period, in which the charge transfer unit (the first charge retaining unit 121 and the second charge retaining unit 122) does not transfer the charge, is retained in the charge retaining unit (the first charge retaining unit 121 and the second charge retaining unit 122). As a result, when charges overflowed from the photoelectric conversion unit 101 are accumulated, the potential of the charge retaining unit (the first charge retaining unit 121 and the second charge retaining unit 122) can be adjusted.

Furthermore, the imaging device according to the present disclosure includes the photoelectric conversion unit 101, the charge retaining unit (the first charge retaining unit 121 and the second charge retaining unit 122), the charge transfer unit 102, the reset unit 103, the image signal generating unit 110, the capacitive coupling wiring 141, the vertical drive unit 20, and the image processing unit 1003. The photoelectric conversion unit 101 is formed on a semiconductor substrate and performs photoelectric conversion of incident light. The charge retaining unit (the first charge retaining unit 121 and the second charge retaining unit 122) retains a charge generated by the photoelectric conversion. The charge transfer unit 102 transfers the charge generated by the photoelectric conversion to the charge retaining unit. The reset unit 103 discharges the charge retained in the charge retaining unit. The image signal generating unit 110 generates an image signal on the basis of the charge retained in the charge retaining unit. The capacitive coupling wiring 141 is different from wiring that transmits control signals of the charge transfer unit, the reset unit, and the image signal generating unit and wiring that transmits the generated image signal and is capacitively coupled to the charge retaining unit. The vertical drive unit 20 applies an adjustment signal for adjusting the potential of the charge retaining unit via the capacitive coupling wiring. The image processing unit 1003 processes the generated image signal. As a result, the potential of the charge retaining unit can be adjusted.

Note that the effects described herein are merely examples and are not limited, and other effects may also be achieved.

Note that the present technology can also have the following configurations.

(1)
An imaging element comprising:
a photoelectric conversion unit that performs photoelectric conversion of incident light, the photoelectric conversion unit formed on a semiconductor substrate;
a charge retaining unit that retains a charge generated by the photoelectric conversion;
a charge transfer unit that transfers the charge generated by the photoelectric conversion to the charge retaining unit;
a reset unit that discharges the charge retained in the charge retaining unit;
an image signal generating unit that generates an image signal on a basis of the charge retained in the charge retaining unit;
capacitive coupling wiring that is different from wiring that transmits control signals of the charge transfer unit, the reset unit, and the image signal generating unit and wiring that transmits the generated image signal, the capacitive coupling wiring capacitively coupled with the charge retaining unit; and
a potential adjustment unit that applies an adjustment signal for adjusting a potential of the charge retaining unit via the capacitive coupling wiring.

(2)
The imaging element according to the above (1), further comprising: a wiring region in which the wiring that transmits the control signals of the charge transfer unit, the reset unit, and the image signal generating unit, the wiring arranged adjacent to the semiconductor substrate, the wiring that transmits the generated image signal, and the capacitive coupling wiring are arranged.

(3)
The imaging element according to the above (2),
wherein the wiring region includes a plurality of pieces of laminated wiring, and
the capacitive coupling wiring includes the plurality of pieces of wiring.

(4)
The imaging element according to the above (3), wherein the capacitive coupling wiring includes wiring arranged in a layer closest to the semiconductor substrate among the plurality of pieces of wiring.

(5)
The imaging element according to any one of the above (2) to (4), wherein the capacitive coupling wiring is disposed in parallel with at least one of the pieces of wiring that transmit the control signals of the charge transfer unit, the reset unit, and the image signal generating unit in the wiring region.

(6)
The imaging element according to any one of the above (1) to (5),
wherein the charge retaining unit includes a first charge retaining unit, a second charge retaining unit, and a coupling unit that couples the first charge retaining unit and the second charge retaining unit,
the charge transfer unit transfers the charge generated by the photoelectric conversion to the first charge retaining unit,
the reset unit discharges the charge retained in the second charge retaining unit,
the image signal generating unit generates the image signal on a basis of the charge retained in the first charge retaining unit, and
the capacitive coupling wiring is different from wiring that transmits the control signals of the charge transfer unit, the reset unit, the image signal generating unit, and the coupling unit and the wiring that transmits the generated image signal.

(7)
The imaging element according to the above (6), wherein the capacitive coupling wiring is capacitively coupled to either the first charge retaining unit or the second charge retaining unit.

(8)
The imaging element according to the above (6), further comprising:
a second photoelectric conversion unit that performs photoelectric conversion of incident light, the second photoelectric conversion unit formed on the semiconductor substrate;
a third charge retaining unit that retains the charge generated by the photoelectric conversion by the second photoelectric conversion unit; and
a second charge transfer unit that transfers the charge retained in the third charge retaining unit to the second charge retaining unit,
wherein the capacitive coupling wiring is different from wiring that transmits control signals of the charge transfer unit, the reset unit, the image signal generating unit, the coupling unit, and the second charge transfer unit and the wiring that transmits the generated image signal.

(9)
The imaging element according to the above (8), wherein the capacitive coupling wiring is capacitively coupled to any one of the first charge retaining unit, the second charge retaining unit, or the third charge retaining unit.

(10)
The imaging element according to the above (8) or (9), further comprising:

a third charge transfer unit that transfers the charge generated by the second photoelectric conversion unit to the third charge retaining unit, wherein the capacitive coupling wiring is different from wiring that transmits control signals of the charge transfer unit, the reset unit, the image signal generating unit, the coupling unit, the second charge transfer unit, and the third charge transfer unit and the wiring that transmits the generated image signal.

(11)

The imaging element according to any one of the above (1) to (10), wherein the potential adjustment unit applies the adjustment signal for adjusting the charge retaining unit to a high potential in a period in which the charge retaining unit retains the charge.

(12)

The imaging element according to any one the above (1) to (10), wherein the potential adjustment unit applies the adjustment signal for adjusting the charge retaining unit to a low potential in a period in which the charge retaining unit retains the charge.

(13)

The imaging element according to any one the above (1) to (12), wherein the potential adjustment unit applies the adjustment signal when a charge having overflowed from the photoelectric conversion unit in a period, in which the charge transfer unit does not transfer the charge, is retained in the charge retaining unit.

(14)

An imaging device comprising:
a photoelectric conversion unit that performs photoelectric conversion of incident light, the photoelectric conversion unit formed on a semiconductor substrate;
a charge retaining unit that retains a charge generated by the photoelectric conversion;
a charge transfer unit that transfers the charge generated by the photoelectric conversion to the charge retaining unit;
a reset unit that discharges the charge retained in the charge retaining unit;
an image signal generating unit that generates an image signal on a basis of the charge retained in the charge retaining unit;
capacitive coupling wiring that is different from wiring that transmits control signals of the charge transfer unit, the reset unit, and the image signal generating unit and wiring that transmits the generated image signal, the capacitive coupling wiring capacitively coupled with the charge retaining unit;
a potential adjustment unit that applies an adjustment signal for adjusting a potential of the charge retaining unit via the capacitive coupling wiring; and
a processing circuit that processes the generated image signal.

(15)

The imaging device according to the above (14), further including: a wiring region in which the wiring that transmits the control signals of the charge transfer unit, the reset unit, and the image signal generating unit, the wiring arranged adjacent to the semiconductor substrate, the wiring that transmits the generated image signal, and the capacitive coupling wiring are arranged.

(16)

The imaging device according to the above (15),
in which the wiring region includes a plurality of pieces of laminated wiring, and
the capacitive coupling wiring includes the plurality of pieces of wiring.

(17)

The imaging device according to the above (16), in which the capacitive coupling wiring includes wiring arranged in a layer closest to the semiconductor substrate among the plurality of pieces of wiring.

(18)

The imaging device according to any one of the above (15) to (17), in which the capacitive coupling wiring is disposed in parallel with at least one of the pieces of wiring that transmit the control signals of the charge transfer unit, the reset unit, and the image signal generating unit in the wiring region.

(19)

The imaging device according to any one of the above (14) to (18),
in which the charge retaining unit includes a first charge retaining unit, a second charge retaining unit, and a coupling unit that couples the first charge retaining unit and the second charge retaining unit,
the charge transfer unit transfers the charge generated by the photoelectric conversion to the first charge retaining unit,
the reset unit discharges the charge retained in the second charge retaining unit,
the image signal generating unit generates the image signal on a basis of the charge retained in the first charge retaining unit, and
the capacitive coupling wiring is different from wiring that transmits the control signals of the charge transfer unit, the reset unit, the image signal generating unit, and the coupling unit and the wiring that transmits the generated image signal.

(20)

The imaging device according to the above (19), in which the capacitive coupling wiring is capacitively coupled to either the first charge retaining unit or the second charge retaining unit.

(21)

The imaging device according to the above (19), further including:
a second photoelectric conversion unit that performs photoelectric conversion of incident light, the second photoelectric conversion unit formed on the semiconductor substrate;
a third charge retaining unit that retains the charge generated by the photoelectric conversion by the second photoelectric conversion unit; and
a second charge transfer unit that transfers the charge retained in the third charge retaining unit to the second charge retaining unit,
in which the capacitive coupling wiring is different from wiring that transmits control signals of the charge transfer unit, the reset unit, the image signal generating unit, the coupling unit, and the second charge transfer unit and the wiring that transmits the generated image signal.

(22)

The imaging device according to the above (21), in which the capacitive coupling wiring is capacitively coupled to any one of the first charge retaining unit, the second charge retaining unit, or the third charge retaining unit.

(23)

The imaging device according to the above (21) or (22), further including:

a third charge transfer unit that transfers the charge generated by the second photoelectric conversion unit to the third charge retaining unit, in which the capacitive coupling wiring is different from wiring that transmits control signals of the charge transfer unit, the reset unit, the image signal generating unit, the coupling unit, the second charge transfer unit, and the third charge transfer unit and the wiring that transmits the generated image signal.

(24)

The imaging device according to any one of the above (14) to (23), in which the potential adjustment unit applies the adjustment signal for adjusting the charge retaining unit to a high potential in a period in which the charge retaining unit retains the charge.

(25)

The imaging device according to any one of the above (14) to (23), in which the potential adjustment unit applies the adjustment signal for adjusting the charge retaining unit to a low potential in a period in which the charge retaining unit retains the charge.

(26)

The imaging device according to any one of the above (14) to (25), in which the potential adjustment unit applies the adjustment signal when a charge having overflowed from the photoelectric conversion unit in a period, in which the charge transfer unit does not transfer the charge, is retained in the charge retaining unit.

REFERENCE SIGNS LIST 1, 1001 IMAGING ELEMENT
10 PIXEL ARRAY UNIT
20 VERTICAL DRIVE UNIT
30 COLUMN SIGNAL PROCESSING UNIT
100 PIXEL
101 PHOTOELECTRIC CONVERSION UNIT
102 CHARGE TRANSFER UNIT
103 RESET UNIT
104 COUPLING UNIT
105 SECOND PHOTOELECTRIC CONVERSION UNIT
106 SECOND CHARGE TRANSFER UNIT
107 THIRD CHARGE TRANSFER UNIT
110 IMAGE SIGNAL GENERATING UNIT
121 FIRST CHARGE RETAINING UNIT
122 SECOND CHARGE RETAINING UNIT
123 THIRD CHARGE RETAINING UNIT
126 to 129 CAPACITOR
130 SEMICONDUCTOR SUBSTRATE
140 WIRING REGION
141 CAPACITIVE COUPLING WIRING
1000 IMAGING DEVICE
1003 IMAGE PROCESSING UNIT

The invention claimed is:

1. An imaging element comprising:
a photoelectric conversion unit that performs photoelectric conversion of incident light, the photoelectric conversion unit formed on a semiconductor substrate;
a first charge retaining unit that retains a charge generated by the photoelectric conversion;
a first charge transfer transistor that transfers the charge generated by the photoelectric conversion to the first charge retaining unit;
a reset transistor that discharges the charge retained in the first charge retaining unit;
an image signal generating circuit that generates an image signal on a basis of the charge retained in the first charge retaining unit;
capacitive coupling wiring that is different from wiring that transmits control signals of the first charge transfer transistor, the reset transistor, and the image signal generating circuit and wiring that transmits the generated image signal, the capacitive coupling wiring capacitively coupled with the first charge retaining unit;
a potential adjustment circuit that applies an adjustment signal for adjusting a potential of the first charge retaining unit via the capacitive coupling wiring;
a wiring region in which the wiring that transmits the control signals of the first charge transfer transistor, the reset transistor, and the image signal generating circuit, the wiring arranged adjacent to the semiconductor substrate, the wiring that transmits the generated image signal, and the capacitive coupling wiring are arranged, wherein
the wiring region includes a plurality of pieces of laminated wiring, and
the capacitive coupling wiring includes the plurality of pieces of wiring.

2. The imaging element according to claim 1, wherein the capacitive coupling wiring includes wiring arranged in a layer closest to the semiconductor substrate among the plurality of pieces of wiring.

3. The imaging element according to claim 1, wherein the potential adjustment circuit applies the adjustment signal for adjusting the first charge retaining unit to a high potential in a period in which the first charge retaining unit retains the charge.

4. The imaging element according to claim 1, wherein the potential adjustment circuit applies the adjustment signal for adjusting the first charge retaining unit to a low potential in a period in which the first charge retaining unit retains the charge.

5. The imaging element according to claim 1, wherein the potential adjustment circuit applies the adjustment signal when a charge having overflowed from the photoelectric conversion unit in a period, in which the first charge transfer transistor does not transfer the charge, is retained in the first charge retaining unit.

6. An imaging device comprising the imaging element according to claim 1.

7. The imaging device according to claim 6, wherein the capacitive coupling wiring includes wiring arranged in a layer closest to the semiconductor substrate among the plurality of pieces of wiring.

8. An imaging element comprising:
a photoelectric conversion unit that performs photoelectric conversion of incident light, the photoelectric conversion unit formed on a semiconductor substrate;
a first charge retaining unit that retains a charge generated by the photoelectric conversion;
a first charge transfer transistor that transfers the charge generated by the photoelectric conversion to the first charge retaining unit;
a reset transistor that discharges the charge retained in the first charge retaining unit;
an image signal generating circuit that generates an image signal on a basis of the charge retained in the first charge retaining unit;
capacitive coupling wiring that is different from wiring that transmits control signals of the first charge transfer transistor, the reset transistor, and the image signal generating circuit and wiring that transmits the generated image signal, the capacitive coupling wiring capacitively coupled with the first charge retaining unit;
a potential adjustment circuit that applies an adjustment signal for adjusting a potential of the first charge retaining unit via the capacitive coupling wiring;
a wiring region in which the wiring that transmits the control signals of the first charge transfer transistor, the reset transistor, and the image signal generating circuit, the wiring arranged adjacent to the semiconductor substrate, the wiring that transmits the generated image signal, and the capacitive coupling wiring are arranged, wherein
the capacitive coupling wiring is disposed in parallel with at least one piece of the wiring that transmits the control signals of the first charge transfer transistor, the reset transistor, and the image signal generating circuit in the wiring region.

9. An imaging device comprising the imaging element according to claim 8.

10. An imaging element comprising:
a photoelectric conversion unit that performs photoelectric conversion of incident light, the photoelectric conversion unit formed on a semiconductor substrate;
a first charge retaining unit that retains a charge generated by the photoelectric conversion;
a first charge transfer transistor that transfers the charge generated by the photoelectric conversion to the first charge retaining unit;
a reset transistor that discharges the charge retained in the first charge retaining unit;
an image signal generating circuit that generates an image signal on a basis of the charge retained in the first charge retaining unit;
capacitive coupling wiring that is different from wiring that transmits control signals of the first charge transfer transistor, the reset transistor, and the image signal generating circuit and wiring that transmits the generated image signal, the capacitive coupling wiring capacitively coupled with the first charge retaining unit;
a potential adjustment circuit that applies an adjustment signal for adjusting a potential of the first charge retaining unit via the capacitive coupling wiring;
a second charge retaining unit; and
a coupling transistor that couples the first charge retaining unit and the second charge retaining unit, wherein
the first charge transfer transistor transfers the charge generated by the photoelectric conversion to the first charge retaining unit,
the reset transistor discharges the charge retained in the second charge retaining unit,
the image signal generating circuit generates the image signal on a basis of the charge retained in the first charge retaining unit, and
the capacitive coupling wiring is different from wiring that transmits the control signals of the first charge transfer transistor, the reset transistor, the image signal generating circuit, and the coupling transistor and the wiring that transmits the generated image signal.

11. The imaging element according to claim 10, wherein the capacitive coupling wiring is capacitively coupled to either the first charge retaining unit or the second charge retaining unit.

12. The imaging element according to claim 10, further comprising:

a second photoelectric conversion unit that performs photoelectric conversion of incident light, the second photoelectric conversion unit formed on the semiconductor substrate;
a third charge retaining unit that retains the charge generated by the photoelectric conversion by the second photoelectric conversion unit; and
a second charge transfer transistor that transfers the charge retained in the third charge retaining unit to the second charge retaining unit,
wherein the capacitive coupling wiring is different from wiring that transmits control signals of the first charge transfer transistor, the reset transistor, the image signal generating circuit, the coupling transistor, and the second charge transfer-unit transistor and the wiring that transmits the generated image signal.

13. The imaging element according to claim 12, wherein the capacitive coupling wiring is capacitively coupled to any one of the first charge retaining unit, the second charge retaining unit, or the third charge retaining unit.

14. The imaging element according to claim 12, further comprising:
a third charge transfer transistor that transfers the charge generated by the second photoelectric conversion unit to the third charge retaining unit,
wherein the capacitive coupling wiring is different from wiring that transmits control signals of the first charge transfer transistor, the reset transistor, the image signal generating circuit, the coupling transistor, the second charge transfer transistor, and the third charge transfer transistor and the wiring that transmits the generated image signal.

15. An imaging device comprising the imaging element according to claim 10.

16. The imaging device according to claim 15, wherein the capacitive coupling wiring is capacitively coupled to either the first charge retaining unit or the second charge retaining unit.

17. The imaging device according to claim 15, further comprising:
a second photoelectric conversion unit that performs photoelectric conversion of incident light, the second photoelectric conversion unit formed on the semiconductor substrate;
a third charge retaining unit that retains the charge generated by the photoelectric conversion by the second photoelectric conversion unit; and
a second charge transfer transistor that transfers the charge retained in the third charge retaining unit to the second charge retaining unit,
wherein the capacitive coupling wiring is different from wiring that transmits control signals of the first charge transfer transistor, the reset transistor, the image signal generating circuit, the coupling transistor, and the second charge transfer transistor and the wiring that transmits the generated image signal.

18. The imaging device according to claim 17, wherein the capacitive coupling wiring is capacitively coupled to any one of the first charge retaining unit, the second charge retaining unit, or the third charge retaining unit.

19. The imaging device according to claim 17, further comprising:
a third charge transfer transistor that transfers the charge generated by the second photoelectric conversion unit to the third charge retaining unit,
wherein the capacitive coupling wiring is different from wiring that transmits control signals of the first charge transfer transistor, the reset transistor, the image signal generating circuit, the coupling transistor, the second charge transfer transistor, and the third charge transfer transistor and the wiring that transmits the generated image signal.

* * * * *